(12) United States Patent
Ben-Moshe et al.

(10) Patent No.: US 8,822,571 B2
(45) Date of Patent: *Sep. 2, 2014

(54) HIGH REFRACTIVE INDEX CRYSTALLINE COLLOIDAL ARRAYS MATERIALS AND A PROCESS FOR MAKING THE SAME

(75) Inventors: Matti Ben-Moshe, Reut (IL); Sanford A. Asher, Pittsburgh, PA (US); Dan Qu, Pittsburgh, PA (US); Jla Luo, Pittsburgh, PA (US)

(73) Assignee: University of Pittsburgh—of The Commonwealth System of Higher Education, Pittsburgh, PA (US)

( * ) Notice: Subject to any disclaimer, the term of this patent is extended or adjusted under 35 U.S.C. 154(b) by 1221 days.

This patent is subject to a terminal disclaimer.

(21) Appl. No.: 11/888,274

(22) Filed: Jul. 31, 2007

(65) Prior Publication Data

US 2008/0064788 A1 Mar. 13, 2008

Related U.S. Application Data

(60) Provisional application No. 60/834,507, filed on Jul. 31, 2006.

(51) Int. Cl.
*C08K 9/00* (2006.01)
*C09D 5/29* (2006.01)

(52) U.S. Cl.
USPC ........... 523/205; 523/171; 523/202; 523/216; 423/566.1

(58) Field of Classification Search
USPC ........ 436/351; 423/566.1; 523/171, 202, 205, 523/216
See application file for complete search history.

(56) References Cited

U.S. PATENT DOCUMENTS

| 6,433,931 | B1 | 8/2002 | Fink et al. | |
|---|---|---|---|---|
| 7,545,724 | B2 * | 6/2009 | Atarashi et al. | 369/112.01 |
| 2003/0219384 | A1 | 11/2003 | Donath et al. | |
| 2006/0024847 | A1 | 2/2006 | Seker et al. | |
| 2006/0120683 | A1 * | 6/2006 | Kamp et al. | 385/141 |
| 2008/0108730 | A1 * | 5/2008 | Ben-Moshe et al. | 523/171 |
| 2009/0318309 | A1 * | 12/2009 | Kimble et al. | 506/20 |

* cited by examiner

*Primary Examiner* — Hannah Pak
(74) *Attorney, Agent, or Firm* — Paul D. Bangor, Jr.; Clark Hill PLC

(57) ABSTRACT

Disclosed are a new composite material and a process for synthesizing highly charged, highly monodisperse, core-shell particles with high refractive index cores, as well as stable, long lasting crystalline colloidal arrays (CCAs) formed thereof. A preferred embodiment of the core particle can be highly monodisperse zinc sulfide (ZnS) particles and a preferred embodiment of the shell can be highly charged polyelectrolytes. The CCAs formed thereof are charge stabilized photonic crystals that shows distinctive first and second order Bragg diffraction peaks whose locations vary over a wide spectral region from UV through visible to IR, with unusually strong intensity and broad band width due to the high index of refraction. These high refractive index particles are useful in applications such as optical filters, optical coatings, cosmetics and photonic crystals sensors and devices.

13 Claims, 16 Drawing Sheets

HIGH REFRACTIVE INDEX CRYSTALLINE COLLOIDAL ARRAYS MATERIALS AND A PROCESS FOR MAKING THE SAME

CROSS-REFERENCE TO RELATED APPLICATIONS

The present application claims the benefit of U.S. application Ser. No. 60/834,507 entitled High refractive index crystalline colloidal arrays materials and a process for making the same, filed Jul. 31, 2006, the entirety of which is hereby incorporated by reference.

This invention was made with government support under Contract No. 2RO1 DK555348-03A1 awarded by the National Institutes of Health and under Contract No. FA8650-05-2-5042 awarded by the U.S. Air Force. Therefore, the government has certain rights in the invention.

BACKGROUND OF THE INVENTION

1. Field of the Invention

The present invention generally relates to crystalline colloidal arrays (CCAs) comprising core-shell particles composed of an inorganic, high refractive index core and a highly charged polymeric layer surrounding the core. The present invention further relates to methods of making the same. The invention also relates to optical filters, optical coatings, cosmetics and hydrogel-based sensors and devices comprising these CCAs that utilize their diffraction properties.

2. Background Art

Crystalline Colloidal Arrays (CCAs) are three-dimensional arrays of highly monodisperse particles that self assemble into body-centered cubic (BCC) or face-centered cubic (FCC) lattices and Bragg-diffract light according to the lattice spacing and the refractive index ratio between the spheres and the matrix.

Highly monodisperse polymer spheres prepared by emulsion polymerization have been mainly utilized as the high refractive index components of CCAs due to their high monodispersity and high surface charge. (See Holtz, J. H. and Asher, S. A., Nature 389:829-832 (1997) and Asher, S. A., Chapter in Nanoparticles: Building Blocks for Nanotechnology, Rotello, V. M., Ed., Kluwer, N.Y., 2004.) Such lattices have a low refractive index mismatch with the surrounding water, leading to modest diffraction efficiency. In order to increase the refractive index mismatch, the inverse opal technique has been proposed which utilizes a high refractive index matrix (such as $TiO_2$) encompassing air spheres, giving rise to a high refractive index ratio between the spheres and the matrix. Although this method yields highly diffracting media, it encompasses several disadvantages: 1) the lattices lack mechanical stability due to annealing deformations at high temperature; 2) the lattices have high defect density due to annealing and etching defects; 3) the annealed material is highly rigid, thus biologically compatible molecules cannot be readily introduced into the array for sensor applications; and 4) the high refractive index of the material is usually introduced by costly methods such as sputtering.

Zinc sulfide (ZnS) is a high refractive index material which has a bulk refractive index of between 2-3. (ZnS being 2.3-2.55 at the near IR-Visible regions). Moreover, ZnS has no absorption throughout the visible and infrared regions ($\lambda$ between 0.37 μm and 14 μm) making it a good candidate for CCA applications.

U.S. Pat. Nos. 6,433,931 and 6,671,097 describe the use of zinc sulfide as a dielectric contrast-enhancing additive to alternate the refractive index of a polymeric material for photonic crystal applications.

Since the original work of Wilhelmely and Matiević published in Chem. Soc. Faraday Trans. 1, 80: 563 (1984) on precipitating ZnS particles from a homogenous solution of thioacetamide (TAA) and zinc nitrate, a number of investigators have utilized this procedure to prepare monodisperse microparticles in water. (See Celikkaya et al., Americ. Cer. Soc. 73: 245 (1990); Celikkaya et al., Amer. Cer. Soc. 73: 2360 (1990); Vacassy et al., Amer. Cer. Soc. 81:2699 (1998); Nomma et al., J. Colloid Interface Sci. 223:179 (2000); and Duran et al., Colloid Polym Sci. 93:215 (1993)). Further investigations of the reaction mechanism, electrophoretic properties and kinetic studies have also been preformed. (See, Bayer et al., Mater. Chem. 12:2940 (2002); Mencan et al., Faraday Disscuss. 122:203 (2002); Duran et al., J. Colloid Interface Sci. 173:436 (1995); and Eshuis et al., J. Colloid Polym. Sci. 272:1240 (1994)). Eshuis et. al. proposed a mechanism that involves a Brownian coagulation of highly monodisperse, primary nanoparticles, followed by the formation of perfect spheres when the initial particles reach a certain size, e.g., up to ~50 nm. Several parameters were found to play significant roles in controlling the monodispersity and size of the precipitated particles. These are, the reaction temperature, the ratio of thioacetamide (TAA):Zn, and the absolute $Zn^{2+}$ source concentration. Furthermore, agitation, pH and purity were also found to be important for preparing monodisperse particles.

Besides precipitating ZnS from dilute aqueous solutions using a variety of methods along the path of Matiević's original work, efforts were also taken to grow ZnS particles in concentrate media. Sugimoto et al. have proposed to use the "sol-gel" method to produce monodisperse ZnS particles from concentrated solutions of zinc-chelate complexes. (See Sugimoto et al., J. Colloid Interface Sci. 180:305 (1996) and Sugimoto et al, Colloids and Surfaces, A. 135: 207 (1998)). Zinc sulfide nuclei form immediately after the mixing of the sulfur source (TAA) with the zinc source solutions. Within a few minutes, the nucleation is completed. Zinc cations slowly released thereafter from the zinc-chelate complexes would react with sulfide anions decomposed from TAA to form ZnS and grow onto the nuclei to form monodisperse ZnS particles. By controlling the composition and concentration of the Zn-chelate solution and the reaction time, it is possible to produce a high yield of monodisperse zinc sulfide particles of controlled sizes.

Van Blaaderen and co-workers proposed the use of core shell $ZnS:SiO_2$ particles as building blocks for photonic crystals. (See, Velikov et al., Appl. Phys. Lett. 80:40 (2002) and Velikov et al, Langmuir 14:4779 (2001)). According to the synthesis procedure described by these authors, most of the zinc sulfide particles were formed during secondary aggregation. Thus the yield is low and the possibility to control the particle size is limited. Liddell and co-workers proposed using non-spherical ZnS colloidal building blocks (>500 nm) for three-dimensional photonic crystals and investigated the formation of dimers, trimers and tetramers in these systems. (See, Liddell et al., J. Colloid Interface Sci. 274:103 (2004); and Liddell et al., Materials Characterization 50:69 (2003)).

Thus, there is a need for preparing high refractive index (n>1.8) monodisperse spheres with sufficient surface charge to allow their self assembly into crystalline colloidal arrays. Therefore, core-shell particles need be made, so that the shells might be sufficiently charged to enable the particles to form CCA.

It is possible to coat core particles of micro to nano sizes with several methods. One path is interfacial polymerization, as has been performed on $SiO_2$ particles. (See Bourgeat-Lami et al., J. Colloid Interface Sci., 197: 293 (1998) and Xu et al., J. Am. Chem. Soc., 126: 7490 (2004)). However, it is impossible to apply this method directly to ZnS particles, as the oligomers in the solution would not attach to the ZnS surface. Another path is to coat colloidal particles with alternating layers of positively and negatively charged polyelectrolytes which are polymers with groups capable of ionic dissociation. (See Sukhorukov et al., Colloids Surfaces A, 137: 253 (1998) and Sukhorukov et al., Polymers for Advanced Technologies, 9: 759 (1998)). U.S. Pat. No. 7,101,575 has used this method as an intermediate step to make hollow capsules. However, although particles may be coated this way in aqueous solutions, they do not readily form crystalline structures, as the repulsive forces between the particles are usually insufficient for the particles to stabilize, either due to insufficient surface charge, or due to the screening of salt ions and other impurities. Even if such a crystalline order could temporarily form, it usually decays very quickly. This occurs because the polyelectrolyte chains are only bound to the particle surfaces via electrostatic forces with the aid of additional salt ions. As these salt ions gradually diffuse out of the coated shells, the ionic strength of the particle suspension increases with time. As the CCA is only stabilized by electrostatic forces between the charged surfaces, the increase of ionic strength screens the repulsive forces between particles and causes the order to decay. When too many ions inside the coated shells permeate out and become free ions, the coated layers themselves also fall off. This is especially true with single layer coatings. It had been suggested that continuous washing and time wear also causes polyelectrolyte chains to fall off multi-layer shells. Additionally, multi-layer coating induces bridging of different shells, which is fatal for the formation of CCA.

In summary, there is a need for preparing highly charged, highly monodisperse core-shell particles with high refractive index (n>1.8) that can self assembly into crystalline colloidal arrays.

There is a need for novel, high refractive index, highly monodisperse, highly charged ZnS or ZnO particles that will self assemble into crystalline colloidal arrays and Bragg-diffract light in the visible and near-IR regions. There is also a need for providing a route for the synthesis of such monodisperse ZnS or ZnO particles. There is also a need for providing a method for effectively coating the particles with highly charged shells with long durability and stability, without either bridging between shells or stripping-off of the shells due to time wear. Crystalline colloidal arrays formed by such highly charged, highly monodisperse, high refractive index particles can be useful in photonic crystal applications where a large refractive index contrast is desired in order to increase the diffraction efficiency for coating, filtering and sensing applications. Thin photonic crystal films made of these spheres can result in essentially 100% light diffraction for films <20 µm thick. Thus, such CCAs have use inter alia in optical filters, optical coatings, hydrogel-based sensors and devices that use the diffraction properties of CCAs.

SUMMARY OF THE INVENTION

The present invention provides a core-shell particle that has sufficiently large surface charge density to allow self-assembly of a plurality of the particles into stable, long lasting crystalline colloidal arrays (CCAs), stabilized by the electrostatic repulsions between the particles. These particles comprise high refractive index cores and highly charged shells. CCAs formed by these particles Bragg-diffract light in the UV-visible-IR spectral regions. In preferred embodiments, the core comprises highly monodisperse charged zinc sulfide (ZnS) or zinc oxide (ZnO) particles and mixtures thereof, more preferably ZnS particles. The particle cores are highly monodisperse with diameters in the range of 10 nm to 10.0 µm and have a refractive index in the range of 1.0 to 3.0. The shell layer coating the core may comprise silica-based materials or highly charged polymeric materials either covalently or electrostatically bound to the core particles The highly charged polymeric materials may comprise either a layer of one single kind of polyelectrolyte molecules or multiple layers of alternating, oppositely charged polyelectrolyte molecules of various kinds. Typical and preferred embodiments of polyelectrolytes used in such coatings are poly(styrene sulfonate) (PSS), poly(diallyldimethylammonium chloride) (PDADMAC) and poly(allylamine hydrochloride) (PAH).

The present invention also provides methods for preparing the core particles, especially ZnS particles.

One method (synthesis method #1) of preparing monodisperse ZnS particles comprises reacting zinc nitrate and thioacetamide (TAA) in water/ethylene glycol with nitric acid, wherein the concentration of the nitric acid and the concentration of water determine the size of the ZnS particles.

Another method (synthesis method #2) for preparing monodisperse ZnS particles comprises reacting thioacetamide (TAA) solution with a concentrated solution of metal-ligand complex. The particle size is controlled by changing the composition or the concentration of metal-ligand solution, the reaction temperature or the duration of the reaction.

Further, the invention provides for methods of coating the core particles to provide sufficient charge for the self-assembly of crystalline colloidal arrays, as well as to enable long time stability of the formed CCAs. Preferred embodiments comprise coating ZnS particles with highly charged polymeric shells.

One method (coating method #1) of coating ZnS particles comprises: pre-treating monodisperse ZnS particles to remove impurities, mixing ZnS and the solution of a strongly charged polyelectrolyte at appropriate concentrations with salt addition and under controlled conditions, washing away the excess polyelectrolytes and salt to reduce the ionic strength to below a critical value. The coating itself may be of either single layer coating or multilayers. With multilayer coating, oppositely charged polyelectrolytes are coated onto the ZnS particles layer by layer under controlled condition, with washing cycles in between to remove the excess polyelectrolytes and salt. The final particle suspension is then concentrated and crystalline colloidal arrays will form when the concentration is above a certain critical value.

Another method (coating method #2) of coating ZnS particles comprises coating the monodisperse ZnS particles with a polymeric material through interfacial polymerization and charging the polymer shell with a reactive sulfonated surfactant. The first step comprises: treating ZnS particles with allyl mercaptan to form a solution; removing oxygen from the solution by $N_2$ bubbling; stabilizing the particles in polyvinyl pyrrolidone; adding a thermal initiator to the solution; adding a sulfonated surfactant to the solution to cause polymerization; and dialyzing the particles.

Further, the invention provides for a series of ZnS crystalline colloidal arrays (CCAs) per se., which comprises a plurality of core-shell particles with refractive index between 2 and 3, wherein upon removing all ionic impurities, the CCAs Bragg-diffracts light in the visible and IR spectral regions. The CCAs of the invention may be incorporated into optical filters, optical coatings, cosmetics and hydrogel based sensors that utilize their light diffraction properties.

Compared to existing CCA's made from other materials, the present invention of ZnS CCA has greatly increased the refractive index contrast between the particle and the surrounding medium, thus greatly increasing the diffraction intensity and efficiency as well as the band width of the diffracted wavelength. Furthermore, one of the invented coating methods (coating method #1) greatly simplifies the procedure of putting charges onto the core particles, and is cost effective and time conserving, as well as less hazardous to health.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION OF THE INVENTION

Figure 1:
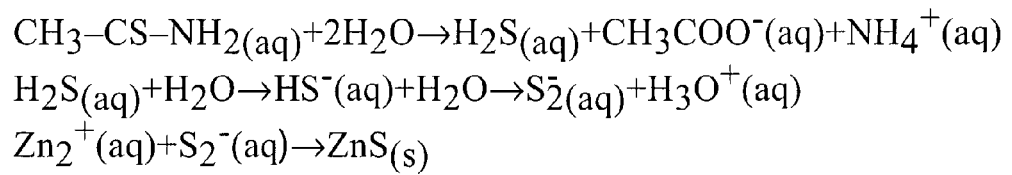
FIG. 1 depicts the reaction scheme for producing ZnS nanoparticles from dilute ethylene glycol/water solution of zinc cations and TAA. (synthesis method #1)

In the following detailed description, reference is made to the accompanying examples and figures that form a part hereof, and in which is shown by way of illustration specific embodiments in which the inventive subject matter may be practiced. These embodiments are described in sufficient detail to enable those skilled in the art to practice them, and it is to be understood that other embodiments may be utilized and that structural, logical, and electrical changes may be made without departing from the scope of the inventive subject matter. Such embodiments of the inventive subject matter may be referred to, individually and/or collectively, herein by the term "invention" merely for convenience and without intending to voluntarily limit the scope of this application to any single invention or inventive concept if more than one is in fact disclosed.

The following description is, therefore, not to be taken in a limited sense, and the scope of the inventive subject matter is defined by the appended claims and their equivalents.

The present invention provides a core-shell particle that has sufficiently large surface charge density to allow self-assembly of a plurality of the particles into stable, long lasting crystalline colloidal arrays (CCAs), stabilized by the electrostatic repulsions between the particles. These particles comprise high refractive index cores and highly charged shells. CCAs formed by these particles Bragg-diffract light in the UV-visible-IR spectral regions. In preferred embodiments, the core comprises highly monodisperse charged zinc sulfide (ZnS) or zinc oxide (ZnO) particles and mixtures thereof, more preferably ZnS particles. The particle cores are highly monodisperse with diameters in the range of 10 nm to 10.0 μm and have a refractive index in the range of 1.0 to 3.0. The shell layer coating the core comprises a highly charged polymeric or silica-based material. The former may comprise a charged polymeric shell covalently bound to the core particles or a polyelectrolyte shell electrostatically bound to the core particles. The latter may comprise either a layer of one single kind of polyelectrolyte molecules or multiple layers of alternating, oppositely charged polyelectrolyte molecules which include polyacids such as polyphosphoric acid, polyvinylsulfuric acid, polyvinylsulfonic acid, polyvinylphosphonic acid and polyacrylic acid, polybases such as polyethyleneimine, polyvinylamine and polyvinylpyridine, and polysalts such as polyphosphate, polysulfate, polysulfonate, polyphosphonate and polyacrylate. Both linear or branched polyelectrolytes can be employed. It is also possible to employ numerous biopolymers such as proteins or chemically modified biopolymers such as ionic polysaccharides, which makes the potential biotech applications more feasible. Typical and preferred embodiments of polyelectrolytes used in such coatings are poly(styrene sulfonate) (PSS), poly(diallyldimethylammonium chloride) (PDADMAC) and poly (allylamine hydrochloride) (PAH).

The present invention also provides methods for preparing the core particles as well as methods for coating the core particles with a highly charged polymeric shell that enables self-assembly of the core-shell particles into crystalline colloidal arrays (CCAs). The CCAs of the invention may be incorporated into optical filters, optical coatings, including color shifting paints, cosmetics and hydrogel based sensors and device.

The invention is described more fully in regard to the preparation of core-shell particles comprising highly charged, highly monodisperse ZnS particles that self assemble into stable, long lasting CCAs.

The present invention provides methods for preparing the monodisperse core particles. A preferred embodiment is highly monodisperse ZnS particles.

One method (synthesis method #1) for preparing the monodisperse ZnS particles comprises precipitating ZnS in ethylene glycol, where thioacetamide (TAA) is allowed to react with traces or low concentration of water to produce the reactive $S^{2-}$ ion that react with the zinc ions to form highly monodisperse ZnS particles. It is possible to obtain monodisperse spherical particles with an average size of 10 nm to 4.0 μm, more preferably 18 nm to up to 2.1 μm, using various reaction conditions. In order to diffract light in the visible spectral region while forming CCA, the particle size may be controlled by changing the nitric acid and water concentrations. Highly monodisperse ZnS nanoparticles in the range of 100-300 nm may be synthesized.

FIG. 1 presents a reaction scheme for producing the monodisperse ZnS particles from dilute ethylene glycol/water solution of zinc salts and thioacetamide (TAA). TAA reacts with traces of water in ethylene glycol to yield hydrogen sulfide ($H_2S$) that further reacts with water to provide a "slow-rate supply" of sulfur ions. The reduced rate of decomposition is believed to lower the precipitation rate relative to the reaction in acidic water and to allow for better control of the size of the nanoparticles.

Ethylene glycol is chosen as the solvent due to its high viscosity, 13.8 cP (~15 times the viscosity of water) and high boiling point (197.5° C.). The reaction may be carried out with low water content to allow a slow reaction rate, due to the small diffusion coefficients. Furthermore, both high temperature and low pH values promote hydrogen sulfide ($H_2S$) formation. (See, Bredol et al., Material Sci. 33:471 (1998)).

The precipitation synthesis of ZnS particles may be divided into two steps. In the first step, monodisperse zinc sulfide seeds form. It is possible to grow monodisperse ZnS nanoparticles with a diameter of up to 63 nm by reacting TAA with traces of water in ethylene glycol.

Figure 2:
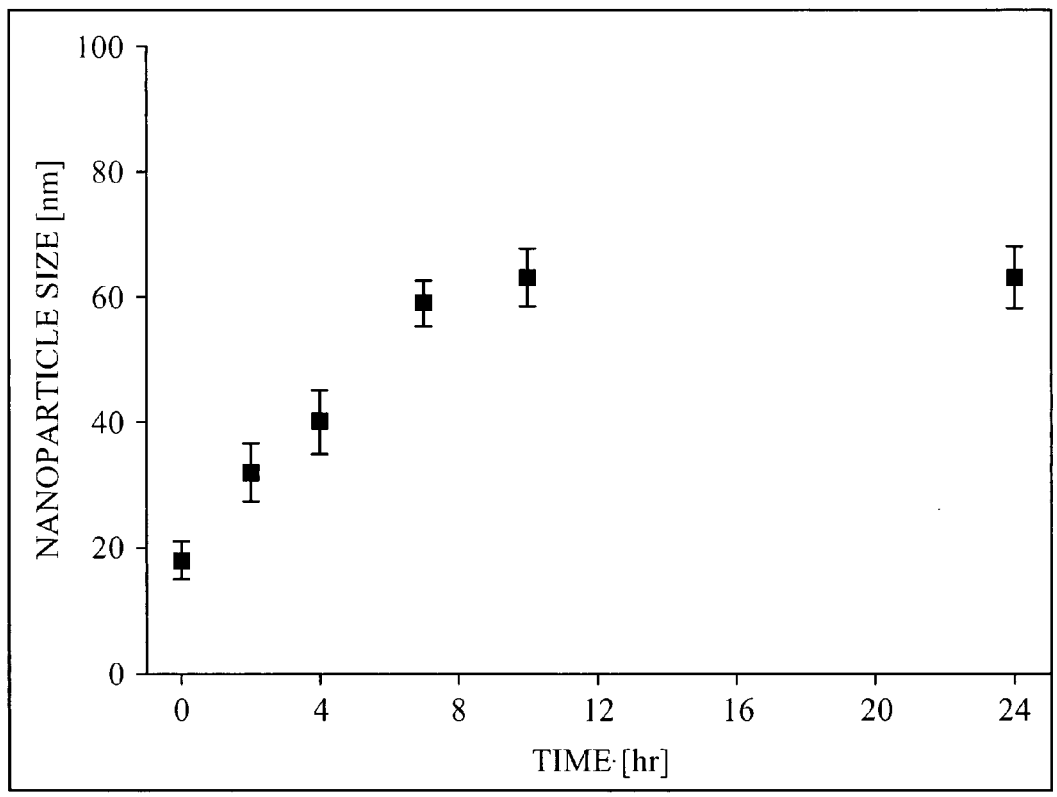
FIG. 2 shows the average size of ZnS nanoparticles during the precipitation reaction in ethylene glycol with traces of water at 70° C. (synthesis method #1)

FIG. 2 shows an example of the size of ZnS nanoparticles precipitated from a solution containing zinc nitrate and TAA at 70° C. as a function of the reaction time. The initial TAA $Zn^{2+}$ ratio was set to 5. The concentration of $Zn(NO_3)_2$ was 0.05M and of TAA was 0.25M. Initial seeds of 18 nm were grown at room temperature prior to the reaction. There was no stirring during the reaction, since stirring may cause inhomogeneous nucleation and therefore polydisperse particle populations. As can be seen in FIG. 2, the growth rate of nanoparticles is relatively low, which may be a consequence of the slow release rate of sulfur during the reaction. The 18 nm seeds grew to 32 nm, 40 nm, 59 nm and finally 63 nm after 2, 4, 7 and 10 hours, respectively. After 10 hours the size of the nanoparticles remained constant. The reaction was carried out for 64 hours.

Figure 3:
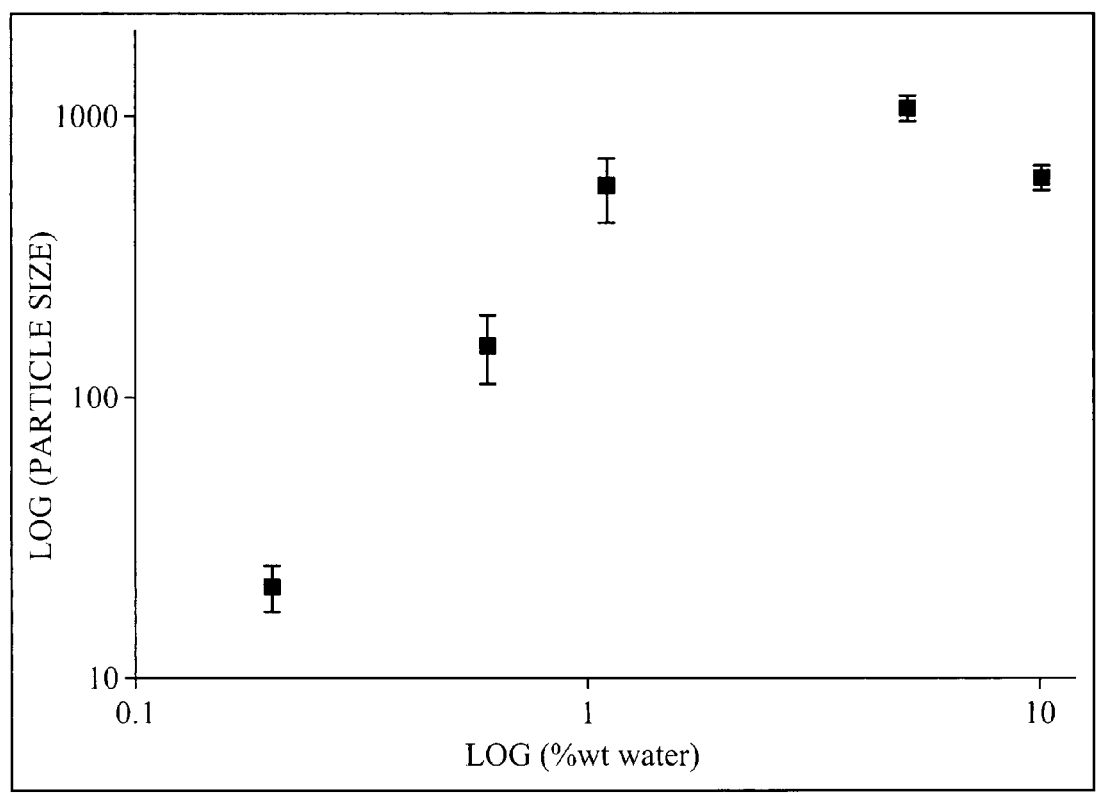
FIG. 3 shows the size of ZnS nanoparticles as a function of water content in the reaction. (synthesis method #1)

When carrying out the reaction in ethylene glycol, it may not be possible to further increase the size of the nanoparticles without decreasing the monodispersity, either by changing the concentrations of zinc and TAA or by increasing the reaction temperature. Therefore, more water was added in order to increase the sulfur concentration during the reaction without affecting the monodisperity. As expected, the reaction proceeded much faster upon the addition of water. FIG. 3 shows the particle size obtained with different water concentrations Each data point is based on the measurement of at least 60 particles imaged with transmission electron microscopy (TEM). Measurements were taken after 1 hr of reaction (with no seeding prior to the reaction in non acidic water). As can be seen in FIG. 3, nanoparticles of sizes of up to more than 1 μm could be grown using this protocol, by varying the amount of water in the reaction, which results in altering the sulfur ion concentration during the reaction.

Figure 4:
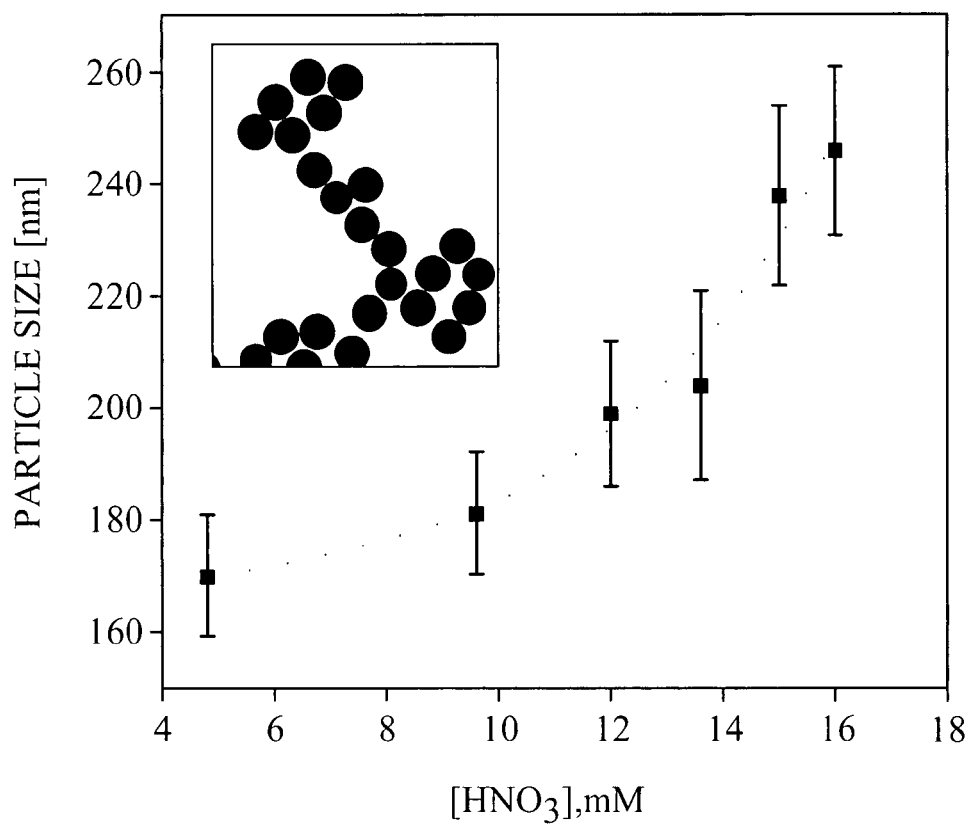
FIG. 4 shows the size of ZnS nanoparticles as a function of $HNO_3$ content in the reaction. (synthesis method #1)
Figure 16:
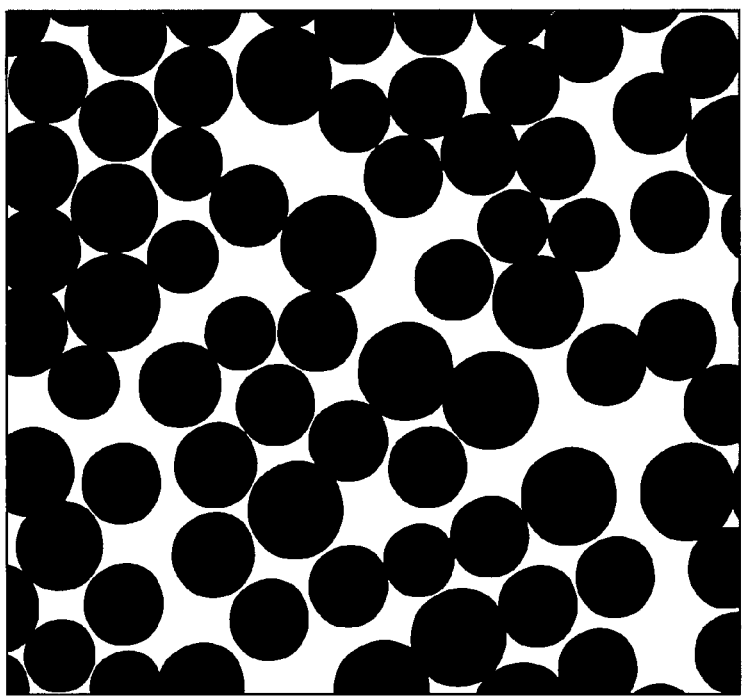
FIG. 16 shows a transmission electron microscope (TEM) image of monodisperse Zn particles with a diameter of 2.11 μm±0.19 μm. (from synthesis method #1)
Figure 16:
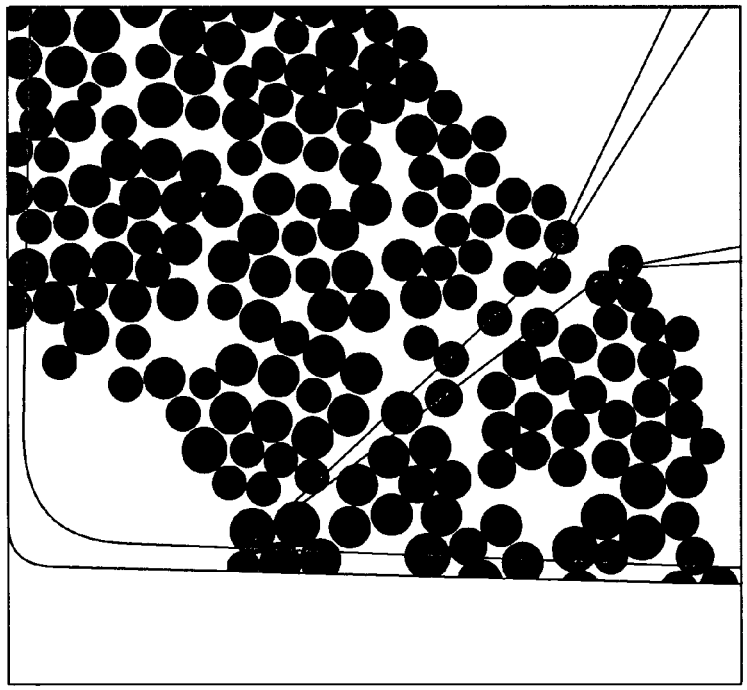
Figure 17:
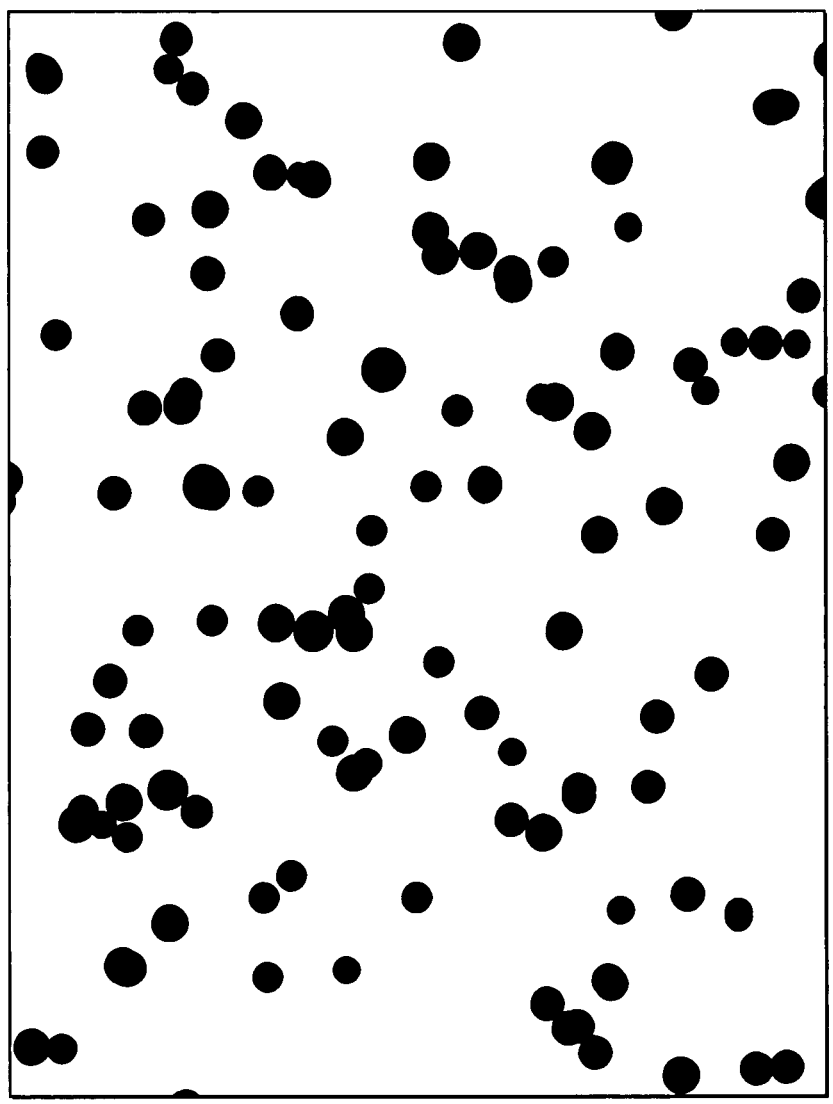
FIG. 17 shows a transmission electron microscope (TEM) image of monodisperse ZnS nanoparticles with a diameter of 142 nm±19 nm. (from synthesis method #2)
Figure 18:
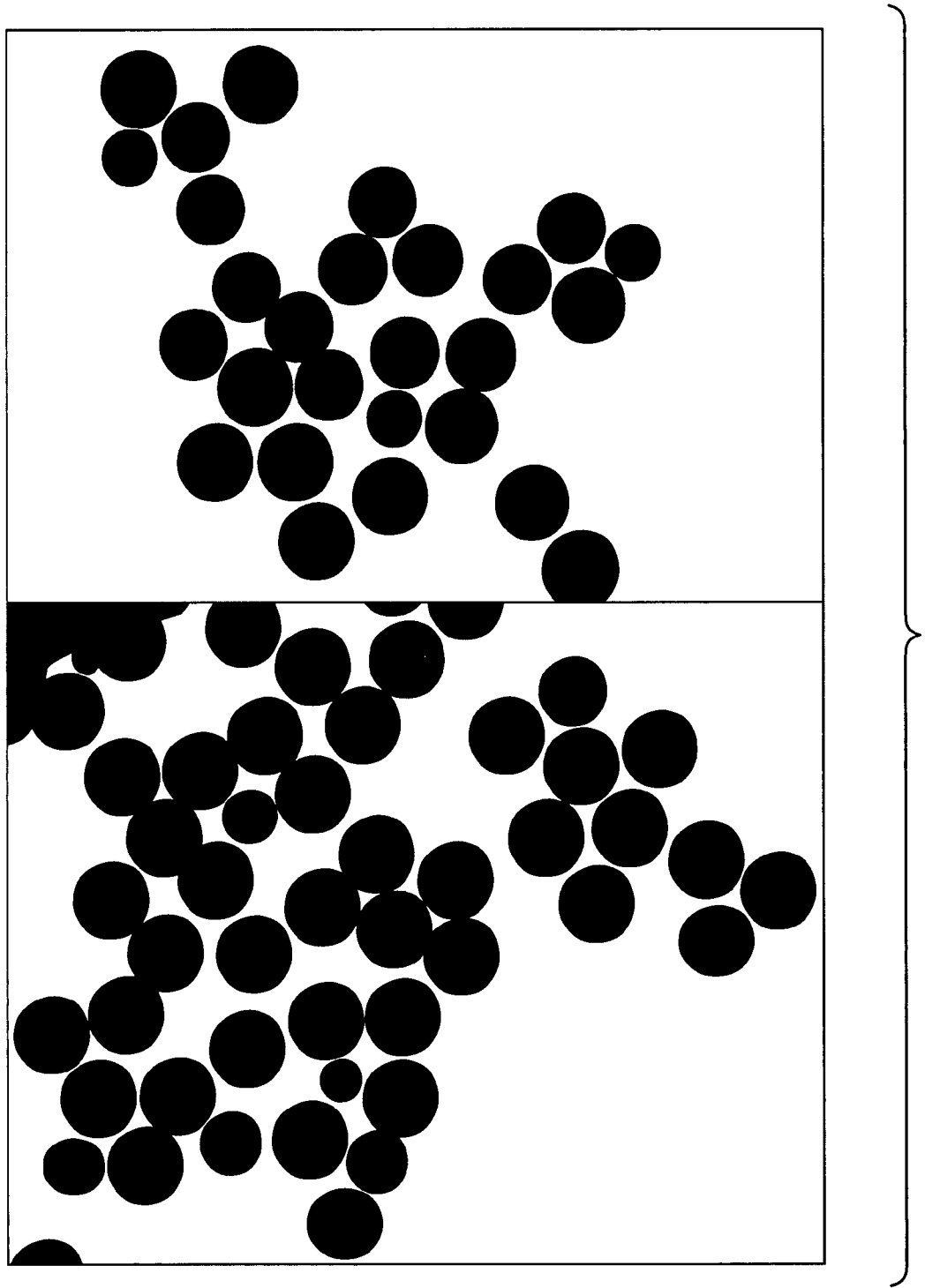
FIG. 18 shows a transmission electron microscope (TEM) image of monodisperse ZnS nanoparticles with a diameter of 342 nm±24 nm. (from synthesis method #2)

As previously described of ZnS precipitation in water, controlling the pH of the reaction significantly improves the monodispersity. As is shown in FIG. 3, when the synthesis was carried out in the presence of 0.6 wt % water with an addition of 32 mM $HNO_3$, the average particle size of the resulting ZnS particles was 2.11 μm±0.4 μm, i.e., a particle size about 20 times larger (shown in FIG. 16) than that produced in the absence of water and $HNO_3$. Thus, the particle size may be controlled by the addition of nitric acid ($HNO_3$) to the reaction mixture. As is shown in FIG. 4, the particle size can be controlled in the range of 170-246 nm by increasing the nitric acid concentration in the range of 4.8-16 mM, while leaving the other reaction parameters constant at 20 wt % water content. The relative standard deviation in particle size in all measurements was between 6-8%. The inset in FIG. 4 shows monodisperse ZnS particles with an average diameter of 246±15 nm, prepared using 16 mM $HNO_3$.

As will be shown later in specific examples, it is possible to further increase the size, while maintaining the monodispersity of the particles, through a more significant change of the sulfur concentration (through variations in temperature, water content, pH and TAA concentration).

Another method (synthesis method #2) for preparing monodisperse ZnS particles in accordance with the present invention comprises mixing thioacetamide (TAA) solution with a concentrated solution of a metal-ligand complex. The ligand which constitutes the metal complex preferably includes compounds containing an oxygen atom or a nitrogen atom capable of coordinating, e.g., compounds having a hydroxyl group, a carbonyl group, an ester group or a carboxyl group and amine compounds. The ligand may be unidentate, bidentate or tridentate. Multidentate ligands are preferred for forming a stable complex. Polynuclear ligand compounds are also employable. Typical embodiments of ligands used are nitrilotriacetic acid (NTA) and ethylenediamine tetraacetic acid (EDTA). The particle size is controlled by changing the composition or the concentration of metal-ligand solution, the reaction temperature or the duration of the reaction. A preferred embodiment of such reactions comprises mixing TAA with concentrate solution of Zn-NTA complex, where zinc cations are slowly released from the complex and react with sulfide anions decomposed from TAA to form monodisperse ZnS particles. It is possible to obtain monodisperse spherical particles with an average size of 40 nm to 1.0 μm, more preferably 100 nm to up to 750 nm, by using various reaction conditions. In order to diffract light in the infra red region while forming CCA, the particle size may be controlled by changing the composition of the Zn-NTA solution, the concentration of the Zn-NTA complex, the reaction temperature or the duration of the reaction appropriately. Highly monodisperse ZnS nanoparticles in the range of 100-500 nm may be synthesized.

Figure 5:
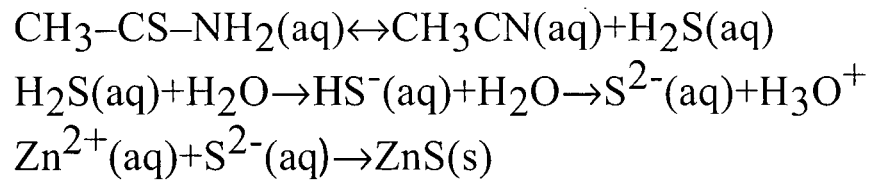
FIG. 5 depicts the reaction scheme for producing ZnS nanoparticles by mixing concentrate zinc-NTA solution with TAA. (synthesis method #2)

FIG. 5 presents a reaction scheme for producing the ZnS particles by mixing a concentrated Zn-NTA solution with TAA. The pH value of the mixture is adjusted to around 9.0 by adding ammonia. In basic media, thioacetamide (TAA) would decompose faster than in acidic media, thus providing excess amount of hydrogen sulfide ($H_2S$) which further reacts with water to provide sulfide anions. The free zinc cations present in the aqueous phase would react with the sulfide anions and form zinc sulfide immediately after the mixing.

The Zn-NTA solution consists of zinc nitrate, nitrilotriacetic acid, ammonium acetate, ammonium hydroxide and gelatin. Typical zinc nitrate concentration is between 0.18M and 0.36M, and the ratio of TAA:Zn is 1:1. Nitrilotriacetic acid is used as chelating agent to coordinate with zinc cations, thus reducing the initial concentration of free zinc cations. The amount of zinc sulfide nuclei is thus controlled to the extent that there is no random agglomeration which would otherwise happen at high zinc cation concentrations when there is no chelation. Ammonium acetate and ammonium hydroxide are used as buffers to maintain a steady high pH value during the reaction, in order to keep a high decomposition rate of TAA to supply sulfide ions in excess. Also, ammonium hydroxide is believed to enhance the growth of ZnS. To prevent aggregation of the growing particles under such high ionic strength, gelatin is added to increase the gel strength of zinc hydroxide network.

The synthesis of monodisperse ZnS particles is composed of two steps: the fast nucleation step and the slow growth step. A controlled amount of zinc sulfide nuclei would form immediately after TAA is mixed with Zn-NTA solution. During the slow growing period, the size of the seed particles increases while ZnS subcrystals formed in solution deposit onto these seeds until stirring. The stirring is stopped shortly after the nucleation, as it is believed that stirring would disturb the attachment of ZnS subcrystals to the seeds.

The final size of the ZnS particles may be controlled by adjusting the initial free zinc ion concentration, which determines the number of seed particles in the nucleation period. It is believed that the number of particles in the mixture stays constant after this short nucleation period. Therefore, given the total amount of zinc in the source solution, the more the number of seeds formed during the nucleation is, the smaller the particle size is when the growing period finishes. In general, decreasing the ratio of NTA to zinc nitrate, or increasing the concentration of Zn-NTA complex, or increasing the amount of ammonium hydroxide may cause the initial concentration of free zinc ions to increase, thus causing the final particle size to decrease. Decreasing the reaction time may also cause the final particle size to decrease.

Several factors may contribute to the monodispersity of the ZnS particles. Most crucially, low initial concentration of free zinc ions is believed to lead to high monodispersity. Thus monodispersity and particle size are interdependent. It is believed that this is why larger particles have lower polydispersity: about 10-15% standard deviation for <200 nm population; about 8-12% standard deviation for 200-300 nm population and about 4-8% standard deviation for 300-500 nm population.

The reaction is typically performed at a temperature range between 30° C. and 60° C. The reaction rate is lower at lower temperature and the reaction time to achieve high yield (e.g. >70%) is accordingly longer under low temperature (e.g. 24 h at 30° C.) as compared to under high temperature (e.g. 4 h at 60° C.) condition. Examples of reactions at different temperatures are given herein.

The invention provides for methods of coating the core particles to provide sufficient charge for the self-assembly of crystalline colloidal arrays, as well as to enable long time stability of the formed CCAs. Preferred embodiments comprise coating ZnS particles with highly charged polymeric shells.

One method (coating method #1) for coating ZnS particles with highly charged polymeric shells comprises mixing ZnS and the solution of a strongly charged polyelectrolyte at appropriate concentrations. With the aid of additional salt, the polyelectrolyte molecules self-assemble onto the ZnS particles and form highly charged shells. The excess polyelectrolytes and salt are then washed away. The total ionic strength of the particle suspension is lowered through washing by deionized (DI) water and the coated ZnS particles are charge stabilized and repel each other. The coating itself can be of single layer or multilayers. With multilayer coating, oppositely charged polyelectrolytes are coated onto the ZnS particles under the same controlled conditions layer by layer, with washing cycles in between to remove the excess polyelectrolytes and salt. The final particle suspension is then concentrated to form crystalline colloidal arrays.

In this method, it is crucial to strictly control several parameters to be in certain prescribed range. Otherwise, particles coated with similar methods would either not self-assemble into CCA due to insufficient surface charge, an overdose of salt or impurities, or temporarily form an unstable CCA whose crystalline order decays fast due to insufficient stability of the surface charge. Specifically, the concentration of the polyelectrolyte during coating must be above certain critical value, the concentration of salt during coating must be within certain small range, core particle must be pretreated and the concentration must be within certain small range, and the final ionic strength of the particle suspension must be controlled below certain critical value.

Figure 6A:
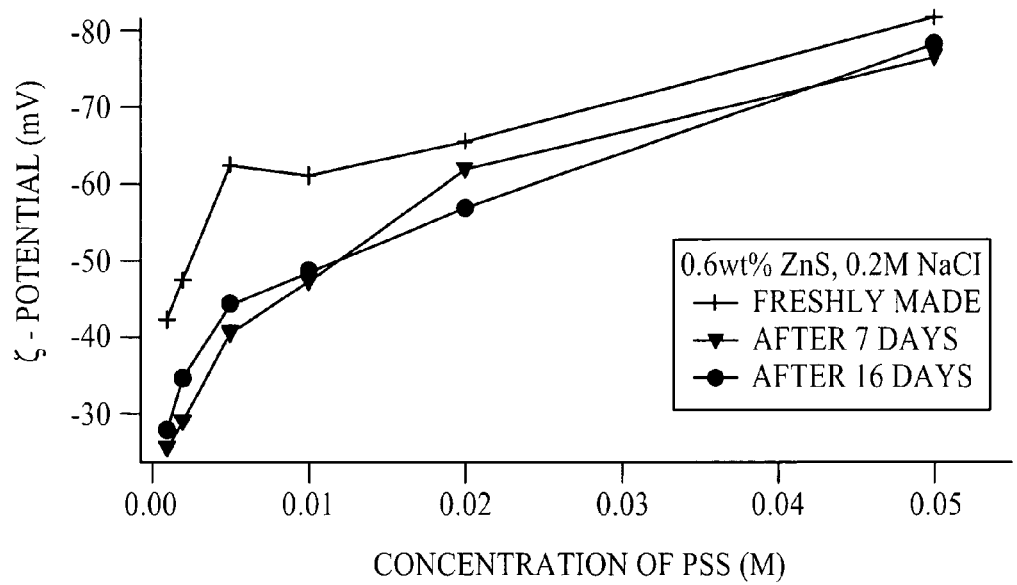
FIG. 6 shows the dependency of ζ-potential on (a) the poly(styrene sulfonate) (PSS) concentration, (b) time, where the ZnS particles are coated with only one layer of PSS. (core-shell particles made by synthesis method #2 and coating method #1)
Figure 6B:
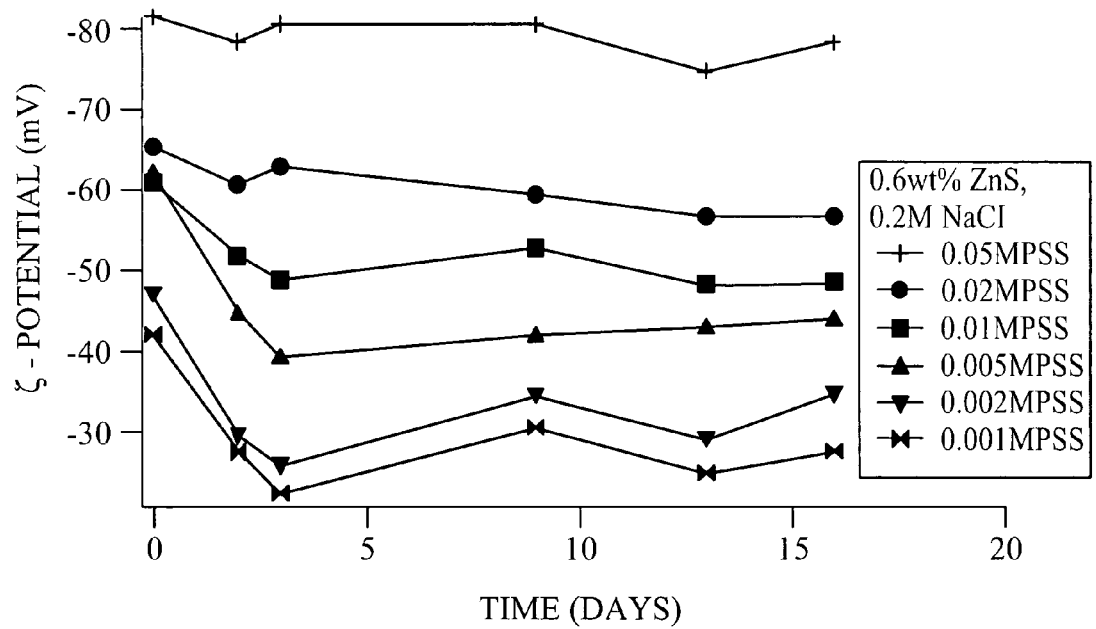

The surface charge of the coated particles can be monitored by the $\zeta$-potential of the particles. For the particles to self-assemble into CCA, it is necessary that the $\zeta$-potential of the particles be above ~±45 mV. Preferably, to have a highly ordered system with strong Bragg diffraction peaks, the $\zeta$-potential needs to be above ±65 mV. Such high surface charge could not be achieved unless the polyelectrolyte concentration used during coating is above 0.02M. (Concentration refers to the repeat unit of monomers). FIG. 6(a) shows an example of the change of $\zeta$-potential vs. PSS concentration, where the ZnS particles are coated with only one layer of PSS. The ZnS particle concentration during coating is fixed at 0.6 wt % and the NaCl concentration during coating is fixed at 0.2M. It is obvious from FIG. 6(a) that PSS concentration below 0.005M cannot even give the ZnS particles sufficient initial surface charge to form CCA. FIG. 6(b) shows the time evolution of $\zeta$-potential of 1-layer PSS coated ZnS particles, where the absolute value of $\zeta$-potential of particles coated with equal or less than 0.01M PSS solutions drops to about or below 50 mV. Only particles coated with >0.02M PSS remain sufficiently charged after 15 days. It is thus preferred that the polyelectrolyte concentration during coating be as high as possible, when applicable, to ensure high charge and high stability of the crystalline order.

Figure 7A:
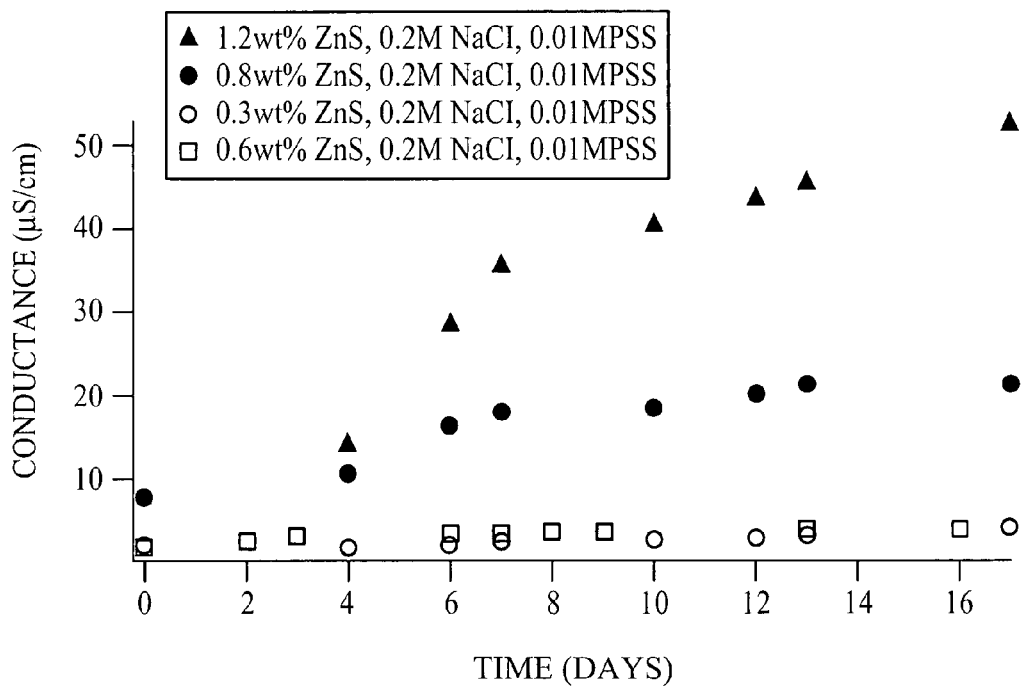
FIG. 7 shows dependencies on time of (a) the conductance of the particle suspension after coating, and (b) the particle ζ-potential, where the ZnS particles are coated with only one layer of PSS. (core-shell particles made by synthesis method #2 and coating method #1)
Figure 7B:
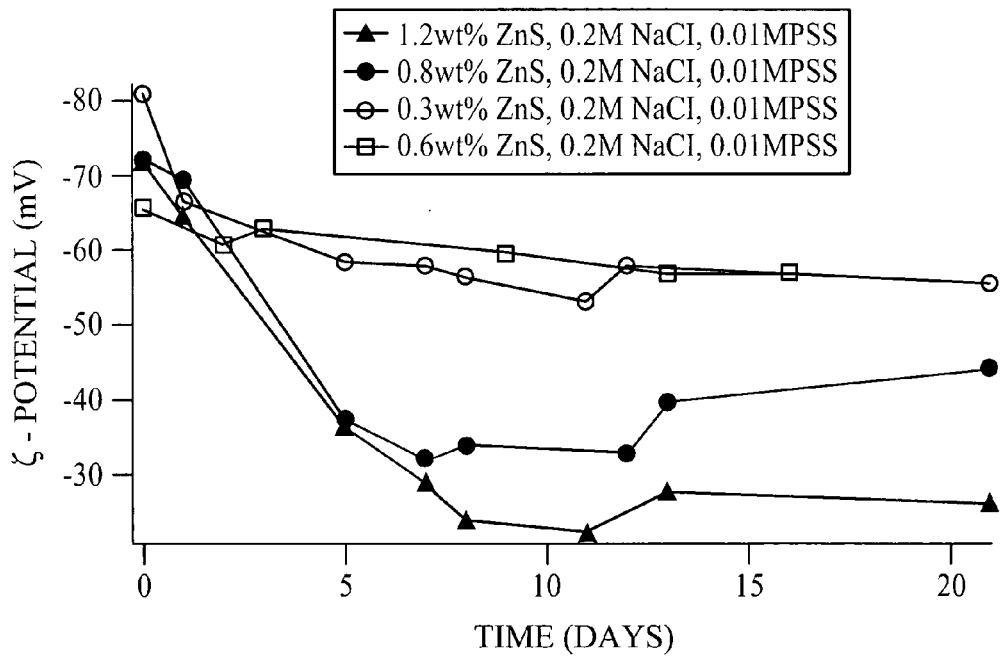

It is not the concentration of polyelectrolyte alone, rather the ratio of the concentration of polyelectrolyte to that of the core particles, that is of crucial importance and controls the surface charge and stability of the system. FIG. 7 shows an example of coating ZnS with PSS, where the concentration of PSS is fixed during the coating of the first three samples, but changed in the last sample to keep the ratio of PSS:ZnS to be the same with the third sample. The concentration of NaCl is kept constant for all the samples. The dependencies of the conductance of the particle suspension after coating vs. time and the particle ζ-potential vs. time are shown respectively in FIGS. 7(a) and (b). The final particle suspension is adjusted to 0.5 wt % (=0.5 mg/ml). Both figures show that when the ratio of PSS:ZnS is the same, the evolution with time is the same, irrespective of the specific PSS and ZnS concentration. However, when the ratio of PSS:ZnS is different, the evolution curve is drastically different. The conductance of the particle suspension is from the residual free ions in the suspension. Although it is reduced to the minimum possible through washing, the ions enveloped inside the polyelectrolyte shells will slowly permeate out, thus increasing the total conductance of the suspension. This is why the conductance of the coated particle suspension always increases over time. However, when the conductance exceeds 10 μS/cm for a 0.5 wt % particle suspension, the crystalline order will be completely destroyed. Therefore, it is important to keep the PSS:ZnS ration above certain critical value. Taking into consideration of the coating effort and efficiency, a preferred ratio is 0.05M PSS:1 wt % ZnS.

Figure 8A:
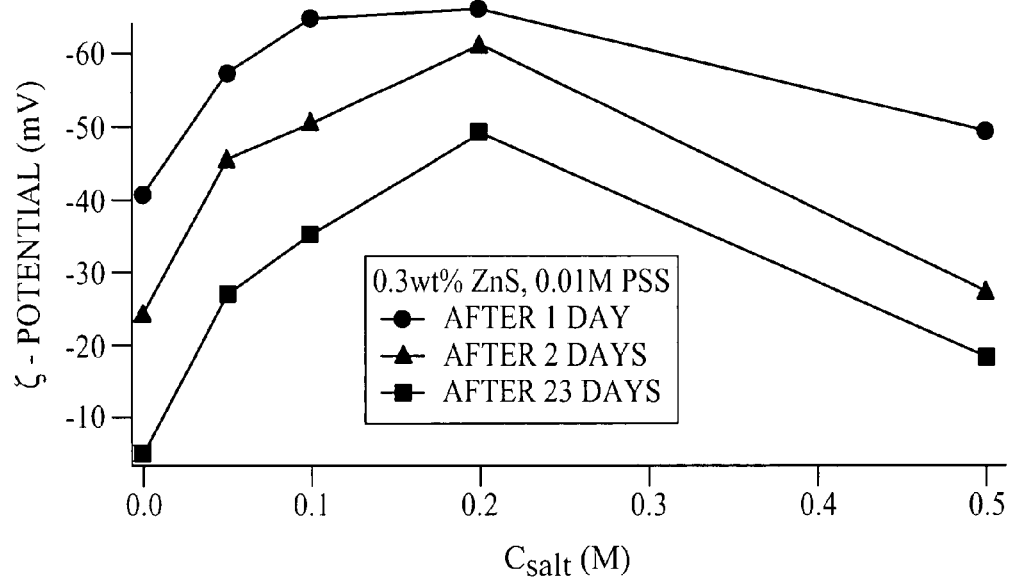
FIG. 8 shows the dependencies of ζ-potential of coated particles on (a) the NaCl concentration, (b) time, where the ZnS particles are coated with only one layer of PSS. (core-shell particles made by synthesis method #2 and coating method #1)
Figure 8B:
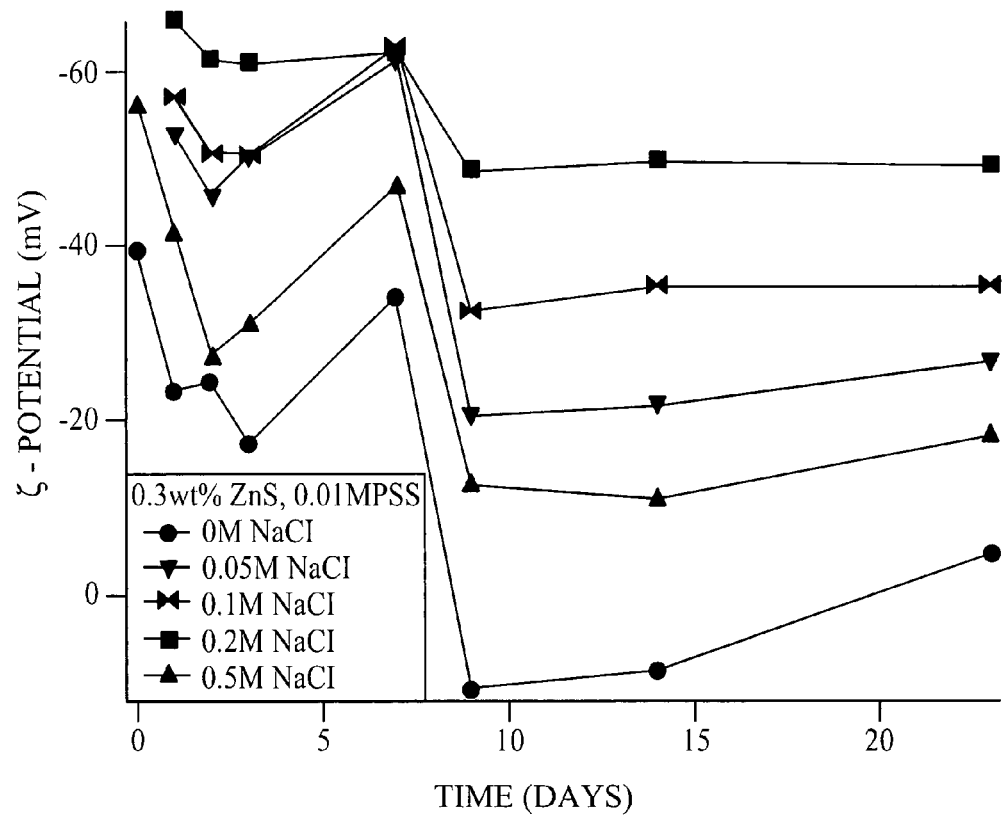

Salt also plays an important role in the process of coating, as well as in preserving a long lasting stability of CCA, as salt ions participate in the binding of polyelectrolyte chains to the particle surface. The following example demonstrates the influence of salt on the initial surface charge and time evolution of the surface charge. FIG. 8(a) shows the dependency of the ζ-potential of the coated particles on the NaCl concentration. FIG. 8(b) shows the time evolution of the ζ-potential of the coated particles. The particle concentration during coating is fixed at 0.3 wt % and the polyelectrolyte concentration is fixed at 0.01M. The dependency of ζ-potential of the particles on the salt concentration is not monotonic, so is the stability of the surface charge. The best regime for the salt concentration would be around 0.2M-0.3M, while at concentrations lower than 0.1M or above 0.5M, the initial surface charge is low and cannot last long. By the 10$^{th}$ day, those coated under unfavorable conditions have already lost most of their surface charge, while those coated with 0.2M NaCl still preserves enough surface charge (ζ-potential ~50 mV) to form CCA.

It is also critical to pre-treat the particles to have a good control of the ionic strength of the coating solution. As has just been demonstrated, too much salt and impurities in the coating solution would cause insufficient inter particle repulsion. Particles not pretreated exhibit much lower ζ-potential than the pretreated particles, even though they are coated under otherwise the same condition. For example, under the condition of 0.01M PSS+0.2M NaCl and 0.5 wt % ZnS, the pretreated particles exhibit a ζ-potential (absolute value) of >60 mV while the particles not pretreated exhibit a ζ-potential (absolute value) of only 20-30 mV.

Figure 9A:
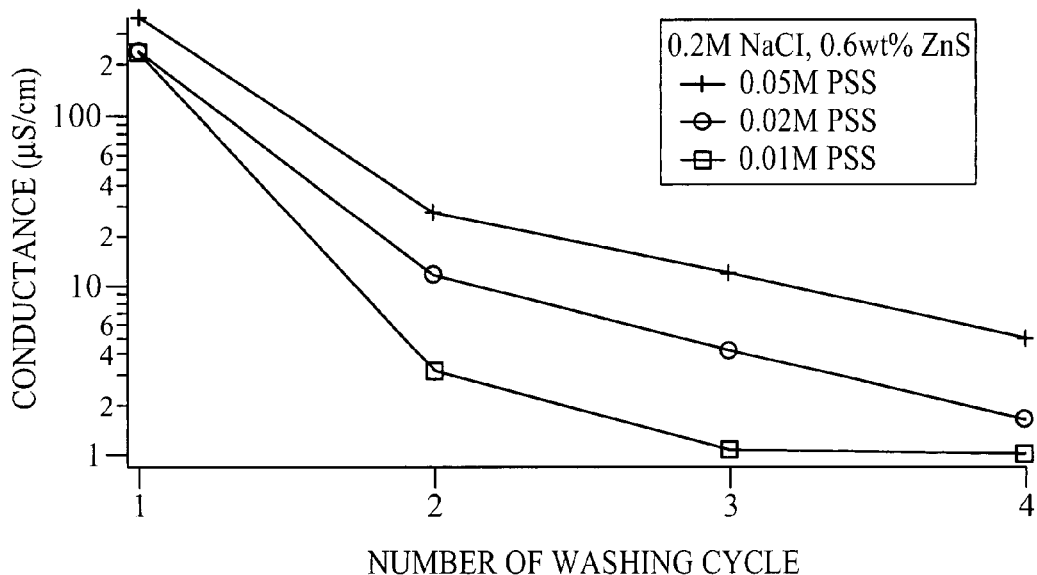
FIG. 9 shows the dependencies of (a) the conductance of particle suspension, and (b) the particle ζ-potential, on the times of washing cycles, where the ZnS particles are coated with only one layer of PSS. (core-shell particles made by synthesis method #2 and coating method #1)
Figure 9B:
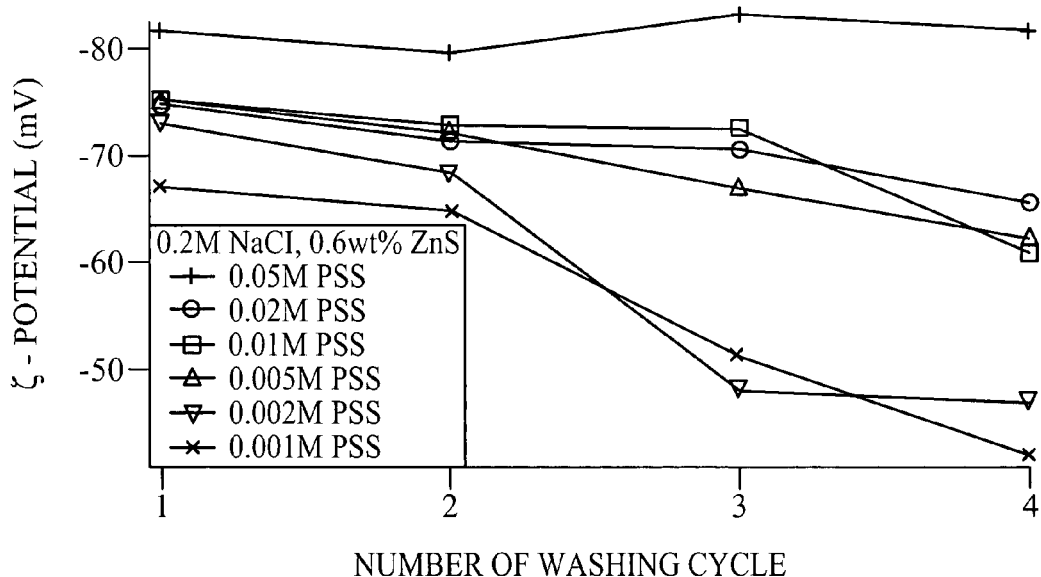

Eventually, after particles are coated under the optimal condition, the suspension must be cleaned to significantly reduce the ionic strength. This can be done in different ways, such as adding resin to the suspension, dialysis or centrifuging/washing cycles which involves centrifuging the particle suspension, decanting the supernatant and washing with water. The following example shows the effect of centrifuging/washing on the particle surface charge and the ionic strength of the suspension. FIGS. 9(a) and (b) shows the effect of washing times on the conductance of particle suspension and the particle ζ-potential respectively. The particles used are coated with one layer of PSS. As has been demonstrated previously, when the polyelectrolyte concentration is high, the coating quality is optimized. If the polyelectrolyte concentration is not high enough, the particle surface charge decreases after washing. However, due to the solubility of polyelectrolyte molecules, it is not feasible to reach any concentration above 0.1M (repeat unit concentration). Further, with each washing cycle, the conductance of the particle suspension is reduced. It is thus important to control the final ionic strength of the particle suspension through monitoring the conductance. Generally speaking, for a particle suspension of 0.5 wt %, a conductance of 5 μS/cm is necessary for forming a well ordered CCA. For particles very strongly charged (ζ-potential>75 mV), the ionic strength strength of the suspension could be relatively higher and it would not hamper the formation of CCA. But 10 μS/cm can be considered the upper limit for 0.5 wt % suspension. Conductance thresholds of suspensions of other concentrations could be approximately estimated proportionally.

All the above examples show the crucial roles the controlling parameters play in achieving high surface charge as well as maintaining a well-ordered crystalline structure for particles coated with the present method. Because the particles are stabilized only by electrostatic forces between the charged surfaces, the increase of ionic strength in the suspension will screen the repulsive force between particles and cause the order to decay over time. When too many ions inside the coated layers permeate out into the suspension and become free ions, the coated layers will also fall off. In fact, until the first demonstration in the present disclosure of the irreversible, long lasting stability of a single layer of polyelectrolyte bound to an inorganic particle surface, it had long been believed that continuous washing and evolution of time would cause polyelectrolyte chains to fall off, which is true for many cases under uncontrolled coating conditions. Thus, it is not the application of polyelectrolytes in coating, but the fine tuning and control of these parameters, that is crucial to the formation and stability of CCA.

Another method (coating method #2) for coating and charging monodisperse ZnS particles is the interfacial/dispersion polymerization method which comprises coating the core particles with a polymeric material, e.g., polystyrene/divinyl benzene (PS/DVB) and then charging the surface by sulfonating the PS shells. It is accomplished by first treating the ZnS particles with allyl mercaptan which serves as a coupling agent between the particles and the charged polymer shell layer. Without the present invention of treating the ZnS surface with allyl mercaptan, the affinity of PS to ZnS would be too low for PS to effectively coat the particles. The allyl mercaptan attaches to the ZnS particle surface via sulfur-sulfur bonds and provides the particles surface with a vinyl group that can be further copolymerized into the polymer shell.

Imaging and Optical Measurements of CCAs and Closed Packed Layers

The diffraction from close packed and non-close packed crystalline colloidal arrays (CCAs) comprising the ZnS nanoparticle cores of the invention was measured to demonstrate the utility of the particles in photonic crystal applications.

Figure 10A:
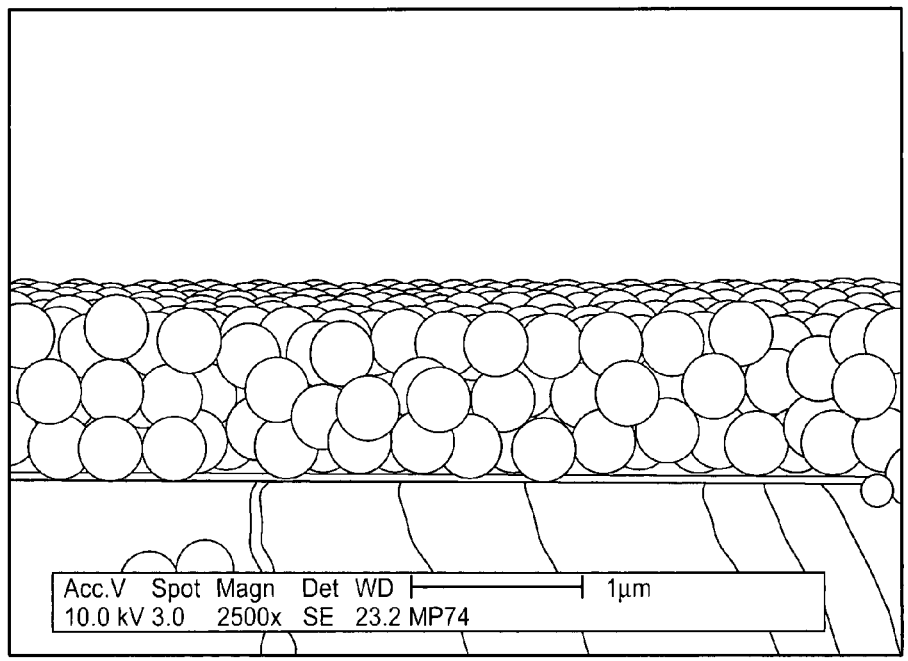
FIG. 10(*a*) shows a scanning electron microscope (SEM) image and (*b*) a cross section of 2D close packed array of ZnS nanoparticles. (core particles made from synthesis method #1).
Figure 10B:
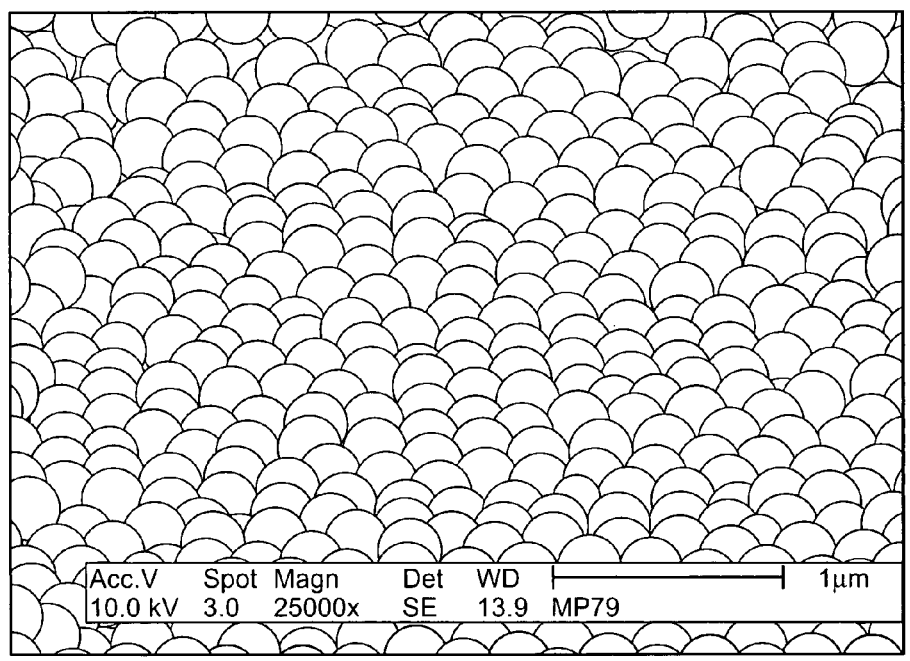

FIG. 10 shows the scanning electron microscopy (SEM) images of a closed pack structure formed by drying a droplet of 10 μl ZnS nanoparticle dispersion in ethyl alcohol on a clean glass slide. A highly ordered crystalline packing is evident.

Figure 11:
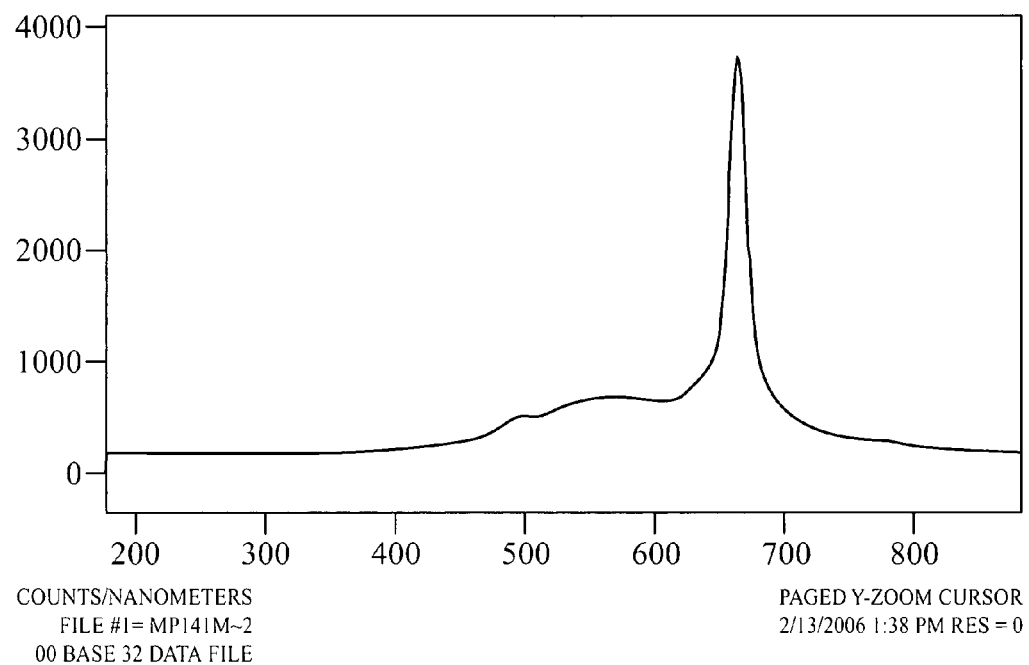
FIG. 11 shows a typical reflectance spectrum of close packed array of ZnS nanoparticles. (core particles made from synthesis method #1)

FIG. 11. shows a typical reflectance spectrum of a close packed ZnS thin film, prepared as that in FIG. 10. The diffraction wavelength can be tuned by varying the colloidal particle size.

Figure 12:
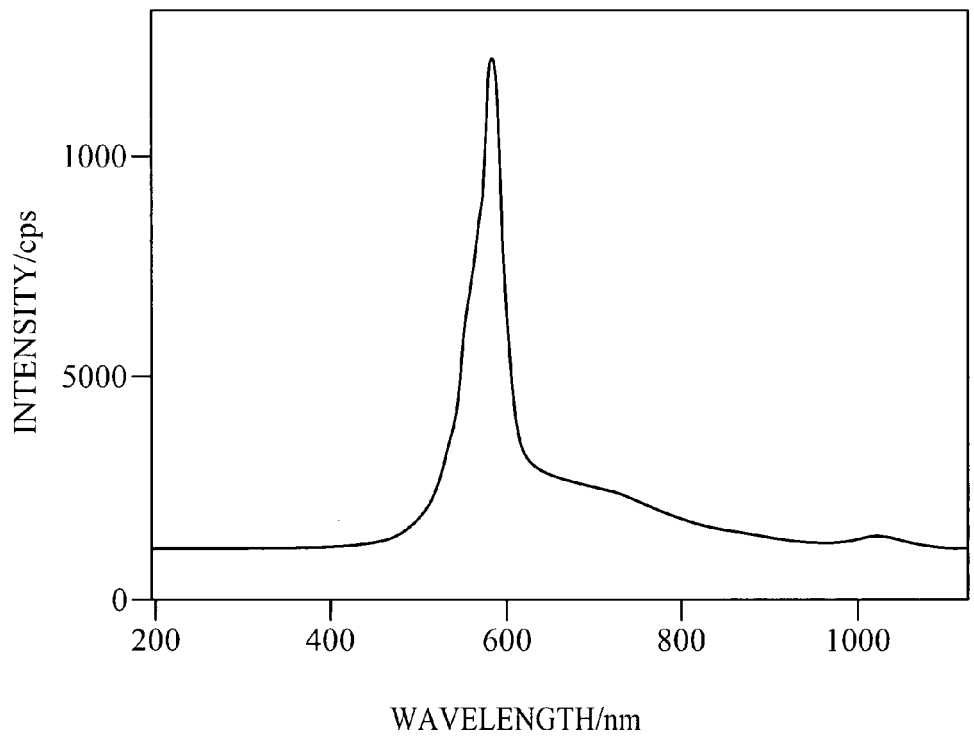
FIG. 12 shows a typical reflectance spectrum of a non-close packed ZnS CCA. The peak corresponds to the second order Bragg diffraction at normal incidence. (from synthesis method #2)

FIG. 12 shows a typical reflectance spectrum of non-close packed ZnS CCA. The peak corresponds to the second order Bragg diffraction at normal incidence. The diffraction wavelength can be tuned by adjusting the colloidal size or the concentration of the particle suspension.

Figure 13:
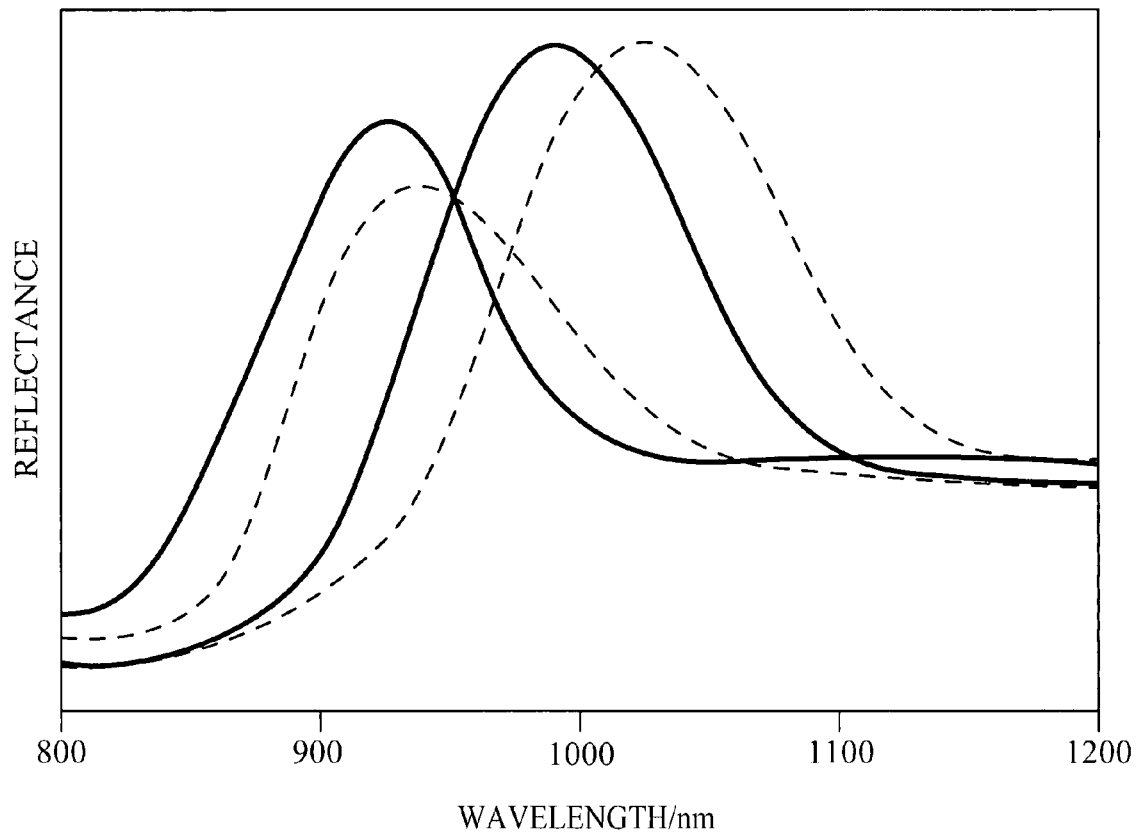
FIG. 13 shows reflectance spectra of a non-close packed ZnS CCA. The peaks correspond to the first order diffractions of the same CCA at different incident angles. (from synthesis method #2)
Figure 14:
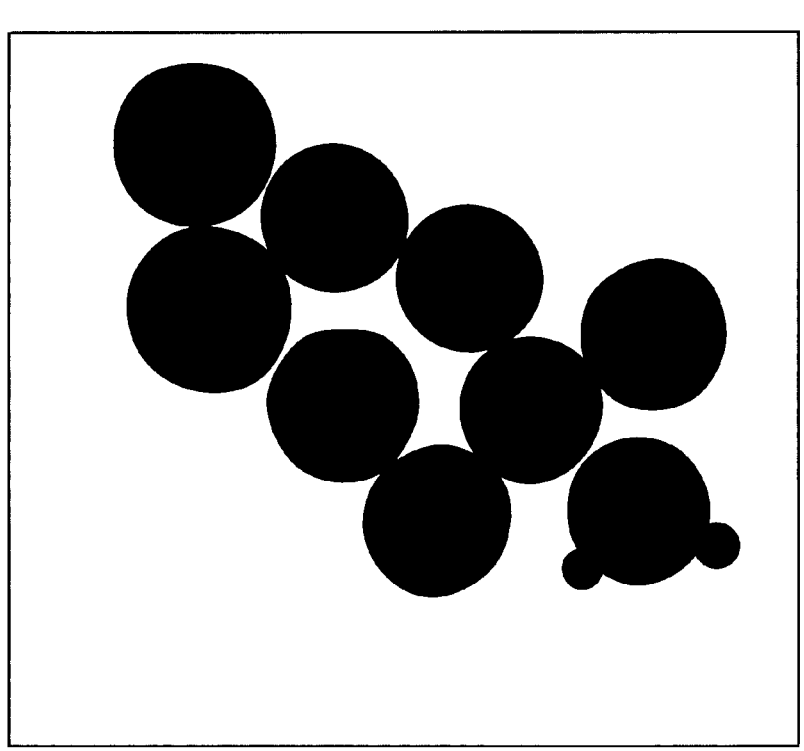
FIG. 14 shows a transmission electron microscope (TEM) image of monodisperse ZnS nanoparticles with a diameter of 134 nm±14 nm. (from synthesis method #1)
Figure 14:
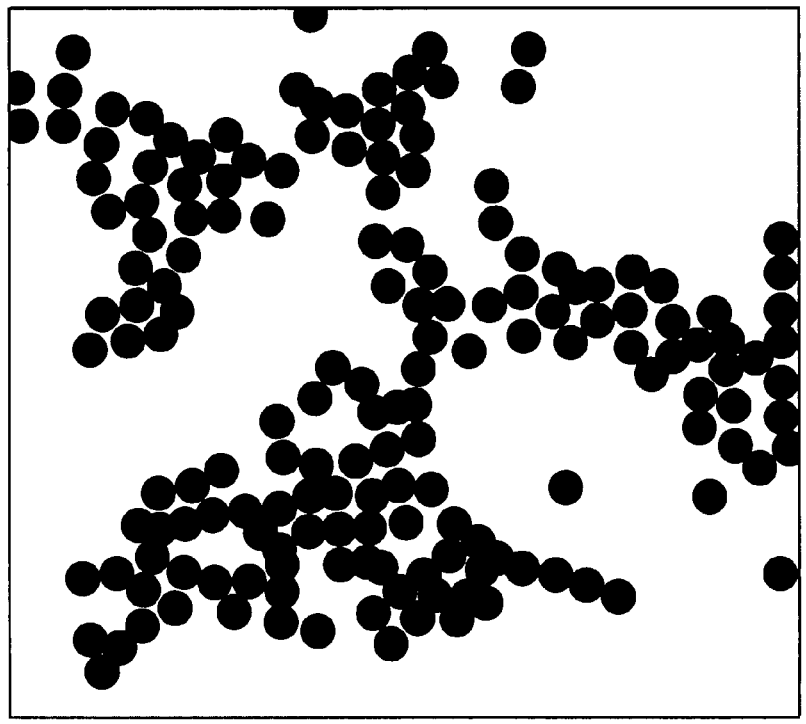
Figure 15:
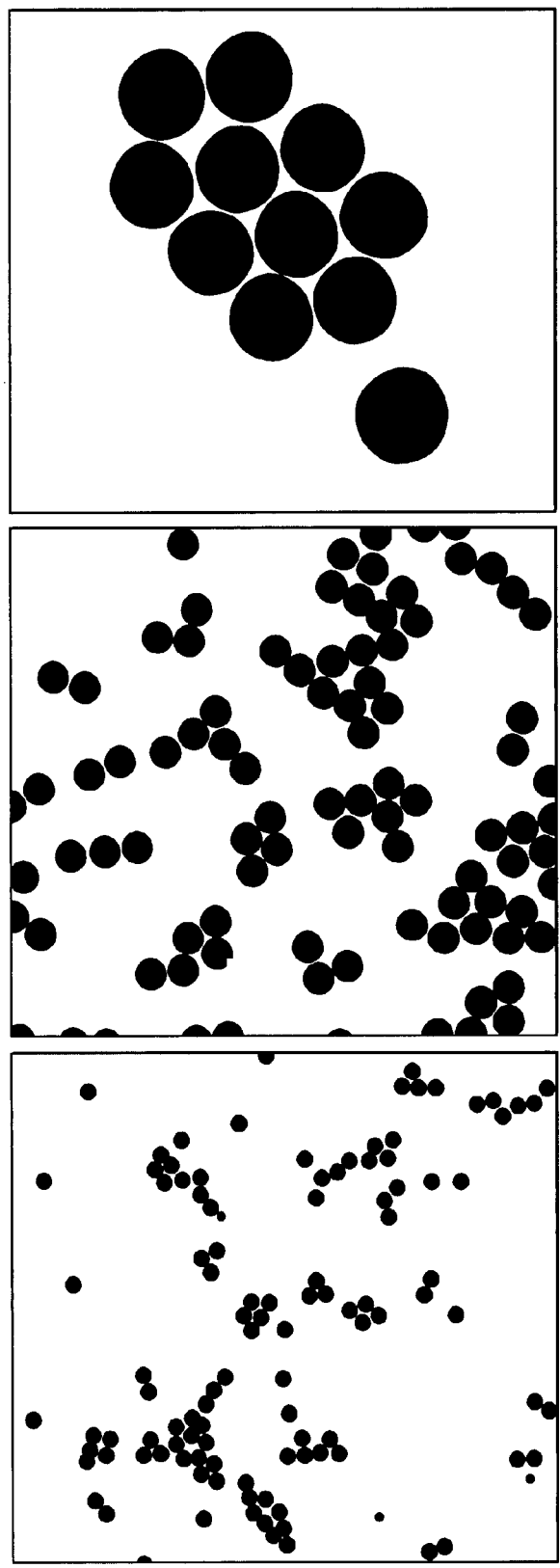
FIG. 15 shows transmission electron microscope (TEM) images of monodisperse ZnS nanoparticles with a diameter of 268 nm±15 nm. (from synthesis method #1)

FIG. 13 shows the reflectance spectra of ZnS CCA at various incident angles. The peaks correspond to the first order diffractions of the same CCA at different incident angles. From left to right, the glancing angles are 40°, 50°, 60° and 70° respectively. The diffraction wavelength red shifts as the glancing angle increases.

FIG. 14-18 show transmission electron microscopy (TEM) images of monodisperse ZnS particles of different sizes, made using both methods.

Figure 19B:
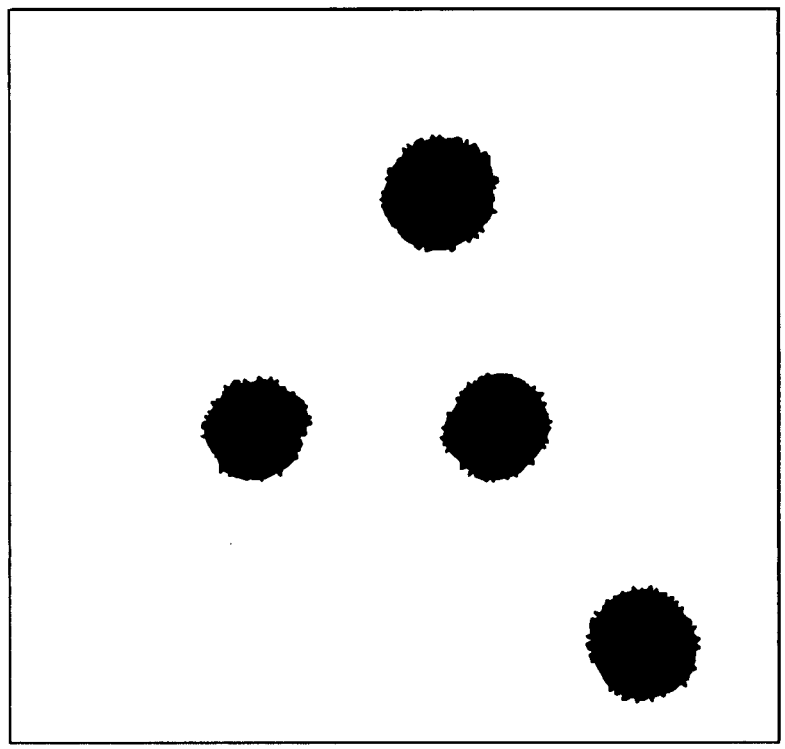
FIG. 19 shows a transmission electron microscope (TEM) image of monodisperse Zn particles (a) before and (b) after coating with polystyrene and divinylbenzene (DVB). (from synthesis method #2 and coating method #2)
Figure 19A:
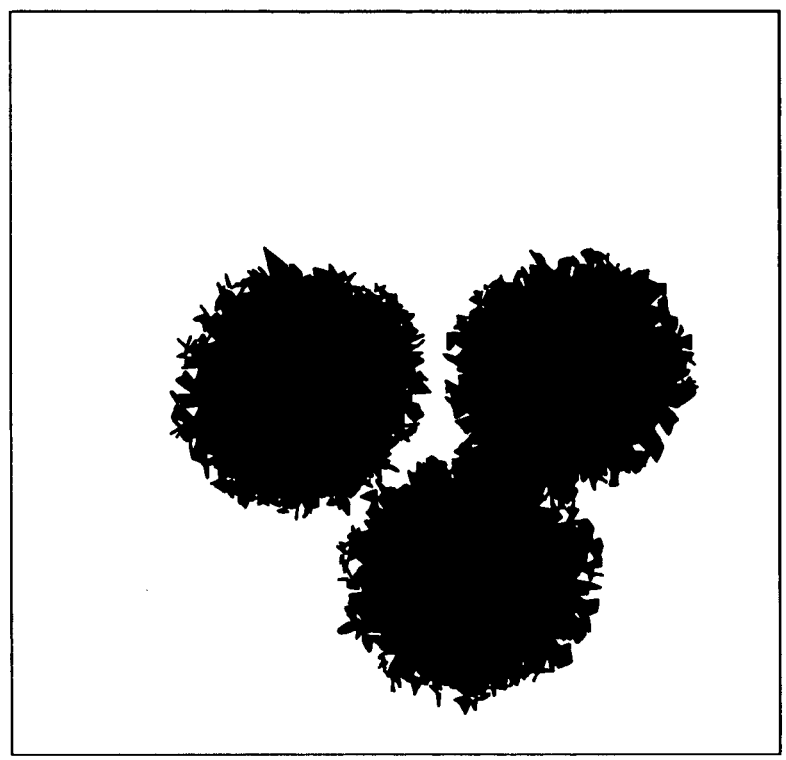

FIG. 19 shows transmission electron microscopy (TEM) images of ZnS particles before and after coating using coating method #2. Images of particles coated with coating method #1 are not shown, since the coated layer is too thin to be visible under TEM.

EXAMPLES

The following examples are intended to illustrate the invention and should not be construed as limiting the invention in any way.

Example 1

4.44 g Zinc nitrate and 11.28 g thioacetamide (TAA) were allowed to react at room temperature in ethylene glycol with 20 wt % acidic water (comprising 5 mM nitric acid). After 18 hours of seeding, 18±2 nm ZnS nanoparticles were formed. The solution mixture was heated to 70° C. Particle size was controlled by the reaction time or the nitric acid concentration and can be tuned in the range of 130-300 nm. The reaction vessel was then cooled down in ice-water bath. After complete cool down, the particles in the solution were centrifuged and re-dispersed in 50 ml ethanol. At that point, particle size was determined by transmission electron microscopy (TEM). After 28 minutes of incubation at 70° C., the particle size was 187±13 nm (standard deviation ~7%). A refractive index of ~2 was estimated from the reflectance spectrum of a closed packed layer of these particles.

Example 2

While the process for preparing monodisperse ZnS particles was optimized using 20 wt % water in the reaction, it is possible to perform the synthesis using different water concentrations by optimizing the amount of thioacetamide (TAA), the reaction temperature and the reaction duration to control the release of sulfur during the reaction. As an example, precipitation of ZnS in ethylene glycol with 0.6 wt % water at 70° C. with 0.8 mM $HNO_3$, 0.25M TAA and 0.025M $Zn(NO_3)_2$ yielded highly monodisperse particles with an average size of 134 nm±14 nm (See FIG. 14).

Example 3

4.44 g zinc nitrate and 11.28 g thioacetamide were allowed to react at room temperature in ethylene glycol with 20 wt % acidic water (comprising 5 mM nitric acid). After 18 hours of seeding, 18±2 nm ZnS nanoparticles were formed. The solution mixture was then heated to 75° C. The reaction vessel was cooled down in ice-water bath. After complete cool down, the particles in the solution were centrifuged and re-dispersed in 50 ml ethanol. At that point, particle size was determined by TEM. After 28 minutes of incubation at 75° C., the particle size was 268±14 nm (standard deviation ~5%). (See FIG. 15.) A refractive index of ~2.2 was estimated from the reflectance spectrum of a close packed layer of these particles.

Example 4

4.44 g zinc nitrate and 11.28 g thioacetamide were allowed to react at room temperature in ethylene glycol with 0.5 wt % acidic water (comprising 32 mM nitric acid). After 5 hours of seeding, 20±2 nm ZnS nanoparticles were formed. The solution mixture was heated to 75° C. The reaction vessel was cooled down in a water bath. After complete cool down, the particles were centrifuged and re-dispersed in 50 ml ethanol. At that point, the particle size was determined by TEM. After 90 minutes of incubation at 75° C., the particle size was 2.11±0.19 μm (standard deviation ~9%). (See FIG. 16.)

Example 5

The following example describes a method for making 150 nm monodisperse ZnS particles from concentrate mixtures.

Zinc-nitrilotriacetic acid (Zn-NTA) starting solution is prepared as follows:
  6.25 g (0.021 mol) $Zn(NO_3)_2.6H_2O$,
  9.25 g (0.12 mol) $CH_3COONH_4$,
  6.88 g (0.036 mol) nitrilotriacetic acid,
  12 ml 28-30 wt %. $NH_3.H_2O$ and
  0.60 g (1 wt %) gelatin (with bloom number 300)
are dissolved in DI water and the total volume is adjusted to 60 ml.

Thioacetamide (TAA) starting solution is prepared as follows: 1.61 g (0.021 mol) thioacetamide (TAA) and 0.15 g (1 wt %) gelatin (with bloom number 300) are dissolved in 15 ml DI water.

Both starting solutions are preheated to 50° C. in a thermostated water bath before mixing. To initiate nucleation, the TAA solution is instantaneously added to the Zn-NTA solution, while the mixture is vigorously stirred at 50° C. for 1 minute. The stirring is then stopped and the reaction mixture is incubated in a 50° C. water bath for 4 hours. It is advised to stop the reaction by putting the reaction vessel in cold ice water bath immediately, with the addition of 1M HCl solution to lower the pH value to around 5. This product is a mixture of zinc sulfide, zinc hydroxide, gelatin and residual reactants. To purify and separate the zinc sulfide nanoparticles from this mixture, 5M NaOH solution is added to the mixture to hydrolyze the gelatin as well as dissolve the zinc hydroxide. This process is carried out in 60° C. water bath under vigorous stirring. Finally, zinc sulfide particles are centrifuged and washed with DI water for multiple times. The particle size was 142±19 nm as determined by TEM. (See FIG. 17.)

Example 6

The following example describes a method for making 350 nm monodisperse ZnS particles from concentrate mixtures.

Zinc-nitrilotriacetic acid (Zn-NTA) starting solution is prepared as follows:
  4.02 g (0.0135 mol) $Zn(NO_3)_2.6H_2O$,
  6.94 g (0.09 mol) $CH_3COONH_4$,
  5.16 g (0.027 mol) nitrilotriacetic acid, 9 ml 28-30 wt % NH$_3$.H$_2$O and 0.60 g (1 wt %) gelatin (with bloom number 90 to 110) are dissolved in DI water and the total volume is adjusted to 60 ml.

Thioacetamide (TAA) starting solution is prepared as follows:

1.21 g (0.015 mol) TAA and 0.15 g (1 wt %) gelatin (with bloom number 90 to 110) are dissolved in 15 ml DI water.

Both starting solutions are preheated to 45° C. with stirring in a thermostated water bath to melt the gelatin. After both solutions are homogenized, they are cooled down to 30° C. To initiate the nucleation of ZnS, the TAA solution is instantaneously added to the Zn-NTA solution under vigorous stirring at 30° C. for 1 minute. The stirring is then stopped and the reaction mixture is incubated in a 30° C. water bath for 24 hours. It is advised to stop the reaction by putting the reaction vessel in cold ice water bath immediately with the addition of 1M HCl solution to lower the pH value to around 5. This product is a mixture of zinc sulfide, zinc hydroxide, gelatin and residual reactants. To purify and separate the zinc sulfide nanoparticles from this mixture, 5M NaOH solution is added to the mixture to hydrolyze the gelatin as well as dissolve the zinc hydroxide. This process is carried out in 60° C. water bath under vigorous stirring. Finally, zinc sulfide particles are centrifuged and washed with DI water for multiple times. The particle size is 342±24 nm as determined by TEM. (See FIG. 18).

Example 7

The following example describes a method for coating ZnS particles with polyelectrolytes.

STEP 1: Before coating, ZnS particles are first washed with resin particles under vigorous stirring for 30 minutes, to remove the residual impurities. The resin particles are then filtered out. The concentration of the ZnS particle suspension is adjusted to between 0.5 wt % and 1.5 wt %. Depending on the particle size, different concentrations may be desirable. Lower concentrations need to be used for smaller particles to avoid coagulation during coating. For example, 1 wt % is sufficient for particles of ~500 nm diameter, but 0.5 wt % is preferred for particles of ~150 nm diameter.

STEP 2: Polystyrene sulfonate (PSS) solutions may be used for coating. If only one layer is desired, 0.05M PSS solutions may be chosen and 0.3M NaCl may be added to ensure good coating quality. If multilayer coating is desired, an oppositely charged polyelectrolyte such as 0.05M poly (diallyldimethylammonium chloride) (PDADMAC) solution may be chosen and 0.3M NaCl solution is added. Here, all concentrations refer to the final concentration in the solution mixture. The 0.05M concentration of the polyelectrolyte solutions refers to that of the monomer repeat unit.

STEP 3: First, 0.05M PSS+0.3M NaCl is added to the ZnS particle suspension. The mixture is stirred vigorously for 20 minutes and sonicated for 10 minutes and stirred again for 10 minutes.

STEP 4: The mixture is then centrifuged at 3000 rpm for 5 minutes. The supernatant is removed and DI water is added. The entire mixture is then sonicated for 20 minutes which allows the particles to well re-disperse. This washing procedure is repeated for several times and 6000 rpm centrifugation speed is used until the conductance of the well dispersed suspension drops to <5 µS/cm for 0.5 wt % (=5 mg/ml) particle suspension.

STEP 5: If single layer coating is desired, the suspension is then centrifuged for the last time and the supernatant is removed. The final concentration is adjusted to >26 wt % (equivalent of 8 vol %) and CCA will form.

STEP 6: If multilayer coating is desired, 0.05M PDADMAC and 0.3M NaCl are added to the well washed and re-dispersed PSS-coated particle suspension after STEP 4. Then, STEP 3 and STEP 4 are repeated, with only the PSS substituted by PDADMAC. Then 0.05M PSS and 0.3M NaCl are added again to the well washed and re-dispersed particle suspension and STEP 3 and STEP 4 are repeated, until the desired number of coated layers is reached.

The suspension is centrifuged for the last time when the conductance drops to <5 µS/cm for 0.5 wt % (=5 mg/ml) particle suspension, and the supernatant is removed. The final concentration is adjusted to >26 wt % (equivalent of 8 vol %) and CCA will form.

Example 8

The following example describes a method for coating ZnS particles with polymer shells using dispersion polymerization.

The particles were dispersed in isopropanol and were first treated with 0.5 wt % allyl mercaptan for 2 hours, followed by N$_2$ bubbling to remove oxygen from the solution. The coating procedure was carried out after the particles have been stabilized in 1% polyvinyl pyrrolidone (PVP) (Mw=360K). 0.05 wt % thermal initiator (AIBN, that is, 2,2'-azobisisobutyronitrile) was added and the solution was stirred for an additional 1 hr. Then, a 0.9 wt % solution mixture of styrene:divinylbenzene (DVB):Sipomer COPS-I (5:5:1), was injected under N$_2$ bubbing. The polymerization is carried out at 60° C. overnight. Sipomer COPS-I is sodium alloxy hydropropyl sulfonate, a reactive sulfonated surfactant which gives the particle a high surface charge. The resulting polymeric coating is sulfonated polystyrene (PS). The reaction vessel was then cooled down to room temperature and the particles were dialyzed for 1 week. The ZnS particles before coating and after coating are shown in FIG. 19.

All of the references cited herein are incorporated by reference in their entirety.

It is emphasized that the Abstract is provided to comply with 37 C.F.R..sctn.1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment to streamline the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

The invention claimed is:

1. A core-shell particle comprising a core and a charged polymeric shell layer, wherein a plurality of said core-shell particles is capable of self-assembly into a stable crystalline colloidal array that Bragg-diffracts light in the UV-visible-IR spectral regions, and wherein the core-shell particles have a ζ-potential of at least about ±45 mV and a refractive index of greater than about 1.8.

2. The particle of claim 1 wherein said core comprises a monodispersed ZnO particle.

3. The particle of claim 1 wherein said core comprises a monodispersed ZnS particle.

4. The particle of claim 1 wherein said charged polymeric material shell is covalently bound to the core surface.

5. The particle of claim 4 wherein said shell comprises a sulfonated polystyrene.

6. The particle of claim 1 wherein said shell comprises one layer of a single kind of polyelectrolyte.

7. The particle of claim 6 wherein the single kind of polyelectrolyte is selected from the group consisting of polyacids, polybases, polysalts, biopolymers and chemically modified biopolymers.

8. The particle of claim 4 wherein said shell comprises alternate layers of oppositely charged polyelectrolytes.

9. The particle of claim 8 wherein the alternate layers of oppositely charged polyelectrolytes are selected from the group consisting of polyacids, polybases, polysalts, biopolymers and chemically modified biopolymers.

10. The particle of claim 1 wherein said shell comprises a silica based material.

11. The particle of claim 1 wherein said core has an average diameter in the range of 10 nm to 10.0 μm.

12. A stable crystalline colloidal array that Bragg-diffracts light in the UV-visible-IR spectral regions comprising a plurality of core-shell particles comprising a core and a charged polymeric shell layer, wherein each of said plurality of core-shell particles has a refractive index of greater than about 1.8 and a ζ-potential of at least about ±45 mV.

13. A product selected from the group consisting of optical coatings, color shifting paints, optical filters, cosmetics and hydrogel based sensors comprising a stable crystalline colloidal array that Bragg-diffracts light in the UV-visible-IR spectral regions comprising a plurality of core-shell particles comprising a core and a charged polymeric shell layer, wherein each of said plurality of core-shell particles has a refractive index of greater than about 1.8 and a ζ-potential of at least about ±45 mV.

* * * * *